United States Patent
Katznelson et al.

[11] Patent Number: 6,150,911
[45] Date of Patent: Nov. 21, 2000

[54] YOKED PERMANENT MAGNET ASSEMBLIES FOR USE IN MEDICAL APPLICATIONS

[75] Inventors: Ehud Katznelson, Ramat Yishai; Yuval Zuk, Haifa, both of Israel

[73] Assignee: Odin Technologies Ltd., Yokneam Ilit, Israel

[21] Appl. No.: 09/405,835

[22] Filed: Sep. 27, 1999

Related U.S. Application Data

[63] Continuation-in-part of application No. 09/266,073, Mar. 10, 1999, which is a continuation of application No. 08/898,773, Jul. 23, 1997, Pat. No. 5,900,793.

[30] Foreign Application Priority Data

Jul. 24, 1996 [IL] Israel ......................................... 118397
Mar. 17, 1997 [IL] Israel ......................................... 120467

[51] Int. Cl.$^7$ ............................................................ H01F 5/00
[52] U.S. Cl. ........................... 335/299; 335/216; 324/319
[58] Field of Search ........................ 335/216, 299, 335/301, 296; 324/318–321

[56] References Cited

U.S. PATENT DOCUMENTS

| | | |
|---|---|---|
| H1615 | 12/1996 | Leupold . |
| 4,341,220 | 7/1982 | Perry . |
| 4,608,977 | 9/1986 | Brown . |
| 4,695,802 | 9/1987 | Zijlstra . |
| 4,829,252 | 5/1989 | Kaufman . |
| 4,862,086 | 8/1989 | Maeda . |
| 4,875,485 | 10/1989 | Matsutani . |
| 5,134,374 | 7/1992 | Breneman . |
| 5,153,517 | 10/1992 | Oppelt et al. . |
| 5,241,272 | 8/1993 | Friedrich . |
| 5,296,811 | 3/1994 | Ehnholm et al. ....................... 324/319 |
| 5,304,933 | 4/1994 | Vavrek et al. . |
| 5,309,106 | 5/1994 | Miyajima et al. . |
| 5,332,971 | 7/1994 | Aubert . |
| 5,365,927 | 11/1994 | Roemer et al. . |
| 5,390,673 | 2/1995 | Kikinis . |
| 5,410,287 | 4/1995 | Laskaris et al. . |
| 5,428,292 | 6/1995 | Dorri et al. . |
| 5,490,509 | 2/1996 | Carlson et al. . |
| 5,517,169 | 5/1996 | Laskaris et al. . |
| 5,565,831 | 10/1996 | Dorri et al. . |
| 5,568,102 | 10/1996 | Dorri et al. . |
| 5,570,073 | 10/1996 | Muller . |
| 5,574,417 | 11/1996 | Dorri et al. . |
| 5,623,241 | 4/1997 | Minkoff . |
| 5,675,305 | 10/1997 | DeMeester et al. . |
| 5,677,630 | 10/1997 | Laskaris et al. . |
| 5,696,449 | 12/1997 | Boskamp . |
| 5,855,555 | 1/1999 | Crowely .................................. 600/421 |
| 5,880,661 | 3/1999 | Davidson et al. . |
| 5,900,793 | 5/1999 | Katznelson et al. . |

OTHER PUBLICATIONS

Faulkner et al., "Guidelines for Establishing a Virtual Reality Lab", IEEE Engineering in Medicine and in biology, Mar. Apr. 1996 pp. 86–93.

*Primary Examiner*—Lincoln Donovan
*Assistant Examiner*—Tuyen T. Nguyen
*Attorney, Agent, or Firm*—Eitan, Pearl, Latzer & Cohen-Zedek

[57] ABSTRACT

Yoked permanent magnets are disclosed for use in medical applications, particularly permanent magnets for use in magnetic resonance imaging (MRI), magnetic resonance therapy (MRT), and interventional magnetic resonance imaging (IMRI) to produce a volume of substantially uniform magnetic field in a part or organ of a patient's body disposed in an open region between a set of a first and second opposing permanent magnet assemblies, leaving open access to a part or organ of a patient's body. Each of the assemblies consists of a plurality of coaxial concentric permanent magnets. The magnets within each of the assemblies may be spaced-apart along their common axis of symmetry and may be tilted with respect to the common axis of symmetry. The magnets include an open yoke made from a ferromagnetic material for increasing the magnetic field strength within the imaging volume by providing a path for closing magnetic flux lines of the opposing permanent magnet assemblies.

36 Claims, 13 Drawing Sheets

YOKED PERMANENT MAGNET ASSEMBLIES FOR USE IN MEDICAL APPLICATIONS

RELATED U.S. APPLICATIONS

This Application is a continuation in part of U.S. patent application Ser. No. 09/266,073 to Katznelson et al. filed Mar. 10, 1999, titled "PERMANENT MAGNET ASSEMBLIES FOR USE IN MEDICAL APPLICATIONS" is still pending, the entire specification of which is incorporated herein by reference, which is a continuation of U.S. patent application Ser. No. 08/898,773, to Katznelson et al. filed Jul. 23, 1997, titled "PERMANENT MAGNET ASSEMBLIES FOR USE IN MEDICAL APPLICATIONS", now U.S. Pat. No. 5,900,793, the entire specification of which is incorporated herein by reference.

FIELD OF THE INVENTION

This invention relates to permanent magnet assemblies for use in medical applications and particularly to permanent magnet assemblies having an open ferromagnetic yoke for use in magnetic resonance imaging (MRI), magnetic resonance therapy (MRT) and interventional magnetic resonance imaging (IMRI).

BACKGROUND OF THE INVENTION

The principles of MRI are set forth in several patents such as U.S. Pat. No. 5,304,933, which is incorporated herein by reference. MRT, sometimes referred to as interventional MRI or intraoperative MRI, is the performance of an interventional medical procedure on a patient in an MRI system. During the procedure, a surgical instrument is inserted into a patient in order to perform the procedure at a predetermined site in the body. The MRT system is used in this case to monitor in quasi real-time the correct placement of the instrument and also to observe the nature and the extent of the effect of the intervention on the tissue.

In an MRI and/or MRT system a strong uniform magnetic field is required in order to align an objects nuclear spins along the z-axis of a Cartesian coordinate system having mutually orthogonal x-y-z axes. The required strong uniform magnetic field, used for full body imaging, is normally in the order of 0.1 to 2 Tesla. The image quality and the accuracy of an MRI and/or MRT system is dependent on the degree of uniformity of the strong uniform magnetic field. Uniformity is critical in MRI and/or MRT applications because if the strong uniform magnetic field is not properly uniform within the volume of interest, the desired discrimination between different elements, due to the finely controlled magnetic field gradient, will be subject to misinterpretation. Typically, the uniformity required for the strong uniform magnetic field is within the order of 10 ppm within the volume of interest. It is essential for MRT systems used in interventional procedures to be based on an open structure, so as to provide the physician easy access to the intervention site. Presently, most MRI systems employ a large magnet, which effectively surrounds the whole body of the patient, to produce the strong uniform magnetic field. Such magnets are usually large superconductor resistive or permanent magnets, each of which is expensive and heavy. Further, the access to the patient in these cases is obstructed.

Attempts have been made to provide open magnets for interventional procedures by employing two spaced-apart Helmholtz superconductive coil assemblies. They provide only limited space between the assemblies allowing for constricted access by only one person, such as a surgeon. Moreover, they are large, massive, immobile and expensive. See U.S. Pat. No. 5,410,287 (Laskaris et al.) and U.S. Pat. No. 5,428,292 (Dorri et al.).

U.S. Pat. No. 4,875,485 (Matsutani) discloses an apparently more compact configuration, based on a pair of spaced-apart superconductive Helmholtz coil assemblies, arranged for movement relative to a platform carrying the patient. The access to the patient remains restricted in this case as well, due to the additional space occupied by the cryostat. Also, the movement of the coils independently of one another is impractical, because the superconducting properties of the coils require extreme precision in positioning of the two poles, in the absence of which the magnetic system quenches.

In comparison to superconductive systems, permanent magnets are less expensive, generate only a minimal unwanted fringe field and are not involved with liquefied gas handling or vacuum requirements. Open access MRI systems based on permanent magnets have been disclosed by U.S. Pat. No. 4,829,252 (Kaufman) and U.S. Pat. No. 5,134,374 (Breneman). Both are using a pair of opposing magnetic flat circular poles, employed one above the other, with the patient lying down between the magnets. The poles are mounted on end plates, supported by connecting members, which provide return paths for the magnetic flux. These systems are massive and immobile and the access to the patient is encumbered by the supporting structure.

A pair of opposing permanent magnet assemblies for use in MRI, each made of concentric magnetic rings, composed of a set of magnetic polygonal blocks, is disclosed in U.S. Pat. No. 5,332,971 (Aubert). Aubert teaches that the opposing concentric rings within each of the pairs of permanent magnets are to be spaced apart from each other the same distance. The magnet is massive, weighing about 3 tons and is therefore not amenable to movement relative to a patient's body.

In each of the above prior art magnets, used for providing the large uniform magnetic field for MRI and/or MRT applications, the magnetic field is generated in a first stage as uniformly as possible. More uniformity is achieved subsequently by shimming.

U.S. patent application to Panfil and Katznelson, Ser. No. 09/295,814, assigned to the assignee of the present application, filed Feb. 9, 1999, titled "A METHOD FOR DESIGNING OPEN MAGNETS AND OPEN MAGNETIC APPARATUS FOR USE IN MRI/MRT PROBES", the entire specification of which is incorporated herein by reference, discloses open yoked magnets having a ferromagnetic yoke, a plurality of opposed pairs of coaxial ferromagnetic field collimating structures and a plurality of opposed pairs of coaxial permanent magnets disposed between the yoke and the collimating structures.

U.S. patent application to Katznelson et al., Ser. No. 09/274,671 filed Mar. 24, 1999, titled "HYBRID MAGNETIC APPARATUS FOR USE IN MEDICAL APPLICATIONS". The entire specification of which is incorporated herein by reference, discloses hybrid magnetic apparatus including, inter alia, permanent magnet assemblies combined with electromagnets.

SUMMARY OF THE INVENTION

There is therefore provided, in accordance with a preferred embodiment of the present invention, a yoked magnetic structure for use in an MRI device to produce a predetermined volume of substantially uniform magnetic field in a region. The volume has an axis of symmetry parallel to the direction of the magnetic field. The magnetic structure includes a first permanent magnet assembly having a first and a second surface thereof, a second permanent magnet assembly having a first and a second surface thereof, and an open ferromagnetic yoke having a first yoke surface and a second yoke surface. The second yoke surface is shaped as a mirror image of the first yoke surface and is spaced apart from the first yoke surface along the axis of symmetry. The first permanent magnet assembly is attached to the ferromagnetic yoke at a first location with the first surface of the first magnetic assembly facing one side of the region and the second surface thereof facing the first yoke surface. The second permanent magnet assembly is attached to the ferromagnetic yoke at a second location with the first surface of the second permanent magnetic assembly facing the first surface of the first permanent magnet assembly on an opposite side of the region, and the second surface of the second permanent magnetic assembly facing the second yoke surface such that the region is between the first surface of the first permanent magnetic assembly and the first surface of the second permanent magnet assembly.

The first permanent magnet assembly includes a first annular permanent magnet with a first and a second surface thereof. The first surface of the first annular permanent magnet is of a first magnetic polarity and the second surface of the first annular permanent magnet is of a second magnetic polarity. The first annular permanent magnet has an inside diameter. The first annular permanent magnet has at least a portion of the first surface of the first annular magnet lying in a first plane to provide a first magnetic field in the region. The first magnetic field has a zero rate of change in a first direction at a first point in the region.

The first magnet assembly also includes at least a second annular or disc like magnet with a first and a second surface thereof. The first surface of the second annular magnet is of the first magnetic polarity and the second surface of the second annular permanent magnet is of the second magnetic polarity. The second annular permanent magnet has an outside diameter which is smaller than the inside diameter of the first annular permanent magnet, with at least a portion of the first surface of the second annular magnet lying in a second plane spaced from the first plane to provide a second magnetic field whereby the second magnetic field is superimposed upon the first magnetic field in the region, and has a zero rate of change in the first direction at a second point different from the first point.

The second permanent magnet assembly includes a third annular permanent magnet with a first and a second surface thereof. The first surface of the third annular permanent magnet is of the second magnetic polarity and the second surface of the third annular permanent magnet is of the first magnetic polarity. The third annular permanent magnet has an inside diameter. The third annular permanent magnet has at least a portion of the first surface of the third annular magnet lying in a third plane to provide a third magnetic field, such that the third magnetic field is superimposed on the first and second magnetic fields in the region and the third magnetic field has a zero rate of change in the first direction at a third point different from the first and second points.

The second magnet assembly also includes at least a fourth annular permanent magnet having a first and a second surface thereof. The first surface of the fourth annular magnet is of the second magnetic polarity and the second surface of the fourth annular permanent magnet is of the first magnetic polarity, the fourth annular permanent magnet has an outside diameter which is smaller than the inside diameter of the third annular permanent magnet. At least a portion of the first surface of the fourth annular permanent magnet lies in a fourth plane spaced from the third plane to provide a fourth magnetic field, such that the fourth magnetic field is superimposed upon the first, second and third magnetic fields, in the region, and has a zero rate of change in the first direction at a fourth point different from the first, second and third points.

Furthermore, in accordance with another preferred embodiment of the present invention, the magnetic structure further includes an outer casing capable of attachment to the ferromagnetic yoke for mounting the first and second permanent magnet assemblies in opposing relationships by a plurality of adjustment screws. The screws are attached to and adapted to move at least one of the first annular permanent magnet, the at least second annular permanent magnet assembly, the third annular permanent magnet assembly and the at least fourth annular permanent magnet assembly to improve the uniformity of the magnetic field.

Furthermore, in accordance with another preferred embodiment of the present invention, at least one of the first annular permanent magnet, the at least second annular permanent magnet, the third annular permanent magnet and the at least fourth annular permanent magnet includes a plurality of permanently magnetized segments. Each segment is attached to its respective neighboring segments by means of a non-conductive adhesive to reduce eddy currents.

There is further provided, in accordance with a preferred embodiment of the present invention, a yoked magnetic structure for use in an MRI device to produce a predetermined volume of substantially uniform magnetic field in a region. The volume has an axis of symmetry parallel to the direction of the magnetic field. The magnetic structure includes a first permanent magnet assembly having a first and a second surface thereof, a second permanent magnet assembly having a first and a second surface thereof, and an open ferromagnetic yoke having a first yoke surface and a second yoke surface. The second yoke surface is shaped as a mirror image of the first yoke surface and is spaced apart from the first yoke surface along the axis of symmetry.

The first permanent magnet assembly is attached to the ferromagnetic yoke at a first location with the first surface of the first magnetic assembly facing one side of the region and the second surface thereof facing the first yoke surface. The second permanent magnet assembly is attached to the ferromagnetic yoke at a second location with the first surface of the second permanent magnetic assembly facing the first surface of the first permanent magnet assembly on an opposite side of the region, and the second surface of the second permanent magnetic assembly facing the second yoke surface, such that the region is between the first surface of the first permanent magnetic assembly and the first surface of the second permanent magnet assembly.

The first permanent magnet assembly includes a first annular permanent magnet with a first and a second surface thereof. The first annular permanent magnet is radially symmetric with respect to the axis of symmetry. The first surface of the first annular permanent magnet is of a first magnetic polarity and the second surface of the first annular permanent magnet is of a second magnetic polarity. The first annular permanent magnet has an inside diameter. The first annular permanent magnet has at least a portion of the first surface of the first annular magnet lying in a first plane to provide a first magnetic field in the region. The first magnetic field has a zero rate of change in a first direction at a first point in the region.

The first magnet assembly also includes at least a second magnet with a first and a second surface thereof. The second permanent magnet is radially symmetric with respect to the axis of symmetry. The first surface of the second permanent magnet is of the first magnetic polarity and the second surface of the second permanent magnet is of the second magnetic polarity. The second permanent magnet has an outside diameter which is smaller than the inside diameter of the first annular permanent magnet. At least a portion of the first surface of the second magnet lies in a second plane spaced from the first plane to provide a second magnetic field. The second magnetic field is superimposed upon the first magnetic field in the region. The second magnetic field has a zero rate of change in the first direction at a second point different from the first point.

The second permanent magnet assembly includes a third annular permanent magnet with a first and a second surface thereof. The third annular permanent magnet is radially symmetric with respect to the axis of symmetry. The first surface of the third annular permanent magnet is of the second magnetic polarity and the second surface of the third annular permanent magnet is of the first magnetic polarity. The third annular permanent magnet has an inside diameter. The third annular permanent magnet has at least a portion of the first surface of the third annular magnet lying in a third plane to provide a third magnetic field, such that the third magnetic field is superimposed on the first and second magnetic fields in the region. The third magnetic field has a zero rate of change in the first direction at a third point different from the first and second points.

The second magnet assembly also includes at least a fourth permanent magnet having a first and a second surface thereof. The fourth permanent magnet is radially symmetric with respect to the axis of symmetry. The first surface of the fourth magnet is of the second magnetic polarity and the second surface of the fourth permanent magnet is of the first magnetic polarity. The fourth permanent magnet has an outside diameter which is smaller than the inside diameter of the third annular permanent magnet. At least a portion of the first surface of the fourth permanent magnet lies in a fourth plane spaced from the third plane to provide a fourth magnetic field. The fourth magnetic field is superimposed upon the first, second and third magnetic fields, in the region and has a zero rate of change in the first direction at a fourth point different from the first, second and third points.

Furthermore, in accordance with another preferred embodiment of the present invention, the second and the fourth permanent magnets are selected from annular permanent magnets, cylindrical permanent magnets, right regular polygonal prism shaped permanent magnets and right regular polygonal annular permanent magnets.

Furthermore, in accordance with another preferred embodiment of the present invention, the first and the third annular permanent magnets are selected from annular permanent magnets, and right regular polygonal annular permanent magnets.

Furthermore, in accordance with another preferred embodiment of the present invention, the first and second permanent magnet assemblies further include an outer casing, capable of attachment to the ferromagnetic yoke, for mounting the first permanent magnet assembly and the second permanent magnet assembly in opposing relationships by a plurality of movable screws.

Furthermore, in accordance with another preferred embodiment of the present invention, the magnetic structure allows lateral access around a patient's body part located between the first and second permanent magnet assemblies.

Furthermore, in accordance with another preferred embodiment of the present invention, the yoke has two hollow passages passing therethrough to provide additional access paths to the patient's body part by allowing tools to be inserted through the hollow passages to reach the patient's body part.

Furthermore, in accordance with another preferred embodiment of the present invention, the magnetic structure further includes an outer casing capable of attachment to the ferromagnetic yoke for mounting the first and second permanent magnet assemblies in opposing relationships by a plurality of adjustment screws, wherein the screws are attached to and adapted to move at least one of the first annular permanent magnet, the at least second permanent magnet, the third annular permanent magnet and the at least fourth permanent magnet to improve the uniformity of the magnetic field.

Furthermore, in accordance with another preferred embodiment of the present invention, the magnetic structure further includes shaped mumetal shims, fragments of soft iron and fragments of magnetic material of various polarities, disposed on the first or second surface of one or more of the annular permanent magnets, to improve the uniformity of the magnetic field.

Furthermore, in accordance with another preferred embodiment of the present invention, the magnetic structure further includes a temperature control for at least one of the permanent magnets, to improve the uniformity of the magnetic field.

Furthermore, in accordance with another preferred embodiment of the resent invention, the magnetic structure is movable by a MRI compatible motor control in a vertical and a series of horizontal directions, so that a composite image may be formed.

Furthermore, in accordance with another preferred embodiment of the present invention, at least one of the first annular permanent magnet, the at least second permanent magnet, the third annular permanent magnet and the at least fourth permanent magnet includes a plurality of permanently magnetized segments, each attached to its respective neighboring segments by means of a non-conductive adhesive to reduce eddy currents.

Furthermore, in accordance with another preferred embodiment of the present invention, the first and second permanent magnet assemblies have an equal number of permanent magnets.

Furthermore, in accordance with another preferred embodiment of the present invention, the yoke is made of a ferromagnetic material selected from soft iron, a iron-silicon alloy, a nickel-iron alloy, an iron-cobalt-vanadium alloy, soft ferrite, and any combination thereof.

Furthermore, in accordance with another preferred embodiment of the present invention, the first yoke surface and the second yoke surface are flat surfaces parallel to each other and perpendicular to the axis of symmetry.

Furthermore, in accordance with another preferred embodiment of the present invention, the first yoke surface and the second yoke surface are stepped surfaces.

Furthermore, in accordance with another preferred embodiment of the present invention, each of the first yoke surface and the second yoke surface have at least one portion thereof perpendicular to the axis of symmetry.

Furthermore, in accordance with another preferred embodiment of the present invention, the ferromagnetic yoke is a monolithic yoke comprising a single piece of ferromagnetic material.

Furthermore, in accordance with another preferred embodiment of the present invention, the ferromagnetic yoke includes a plurality of parts of ferromagnetic material.

Finally, in accordance with another preferred embodiment of the present invention, the ferromagnetic yoke is selected from a U-shaped yoke and a C-shaped yoke.

BRIEF DESCRIPTION OF THE DRAWINGS

In order to understand the invention and see how it may be carried out in practice, several preferred embodiments will now be described, by way of non-limiting example only, with reference to the accompanying drawings, in which.

DETAILED DESCRIPTION OF THE INVENTION

The present invention is based, in part, upon the realization that whole body imaging is not necessary for the performance of an interventional medical procedure on a patient in an MRI system. It has been realized that, in fact, a machine with a restricted field of view performs satisfactorily in such a setting and can be built in a more efficient and economical fashion than one built for accommodating a whole body. Furthermore, in order to leave an open access to reach conveniently the part of the body on which the intervention is performed, the invention is concerned with assemblies that are compact and also do not incorporate ferromagnetic structures for the creation of return paths of the magnetic flux.

In accordance with this invention, permanent magnet assemblies, each formed from a plurality of annular concentric permanent magnets provide a volume of substantially uniform magnetic field extending from a central portion thereof.

The field strength of a single annular permanent magnet along a z-axis perpendicular to its face and passing through its center is given by the following expression, using the center of the permanent magnet as the origin of the coordinate system:

$$B(z) = \frac{\mu_0 \mu \Phi}{2} \left( \frac{z+h/2}{\sqrt{(z+h/2)^2 + b^2}} - \frac{z-h/2}{\sqrt{(z-h/2)^2 + b^2}} - \frac{z+h/2}{\sqrt{(z+h/2)^2 + a^2}} + \frac{z-h/2}{\sqrt{(z-h/2)^2 + a^2}} \right)$$

where
$\mu_0$ is the permeability of air
$\mu$ is the permeability of the annular permanent magnet
$\Phi$ is the magnetization
a is the inner radius of the annular permanent magnet
b is the outer radius of the annular permanent magnet
h is the height of the annular permanent magnet The uniformity of the magnetic field in the volume is based on the fact that any annular single permanent magnet has one point on its axis and located outside its own plane, of maximum or minimum field strength, so that the derivative of the field strength with respect to the z-axis there is zero (i.e. dB/dz=0). It has been realized that by displacing the upper surfaces of a plurality of concentric annular permanent magnets in the assembly from each other, the respective points of zero derivative can be displaced from each other, allowing the magnetic field in the volume to be made uniform to within a defined tolerance by superimposing each of the curves describing the field strength one on top of each other, so that the point of zero derivative of one curve is superimposed on top of the descending or ascending part of the other. In a like manner the upper surfaces themselves can be created with steps to provide additional displaced points of zero derivative.

The permanent magnet assemblies of this invention can be used in various ways. One way of use is to construct a single permanent magnet assembly by itself, to provide the uniform magnetic field adjacent to the upper surface thereof.

Figure 1:
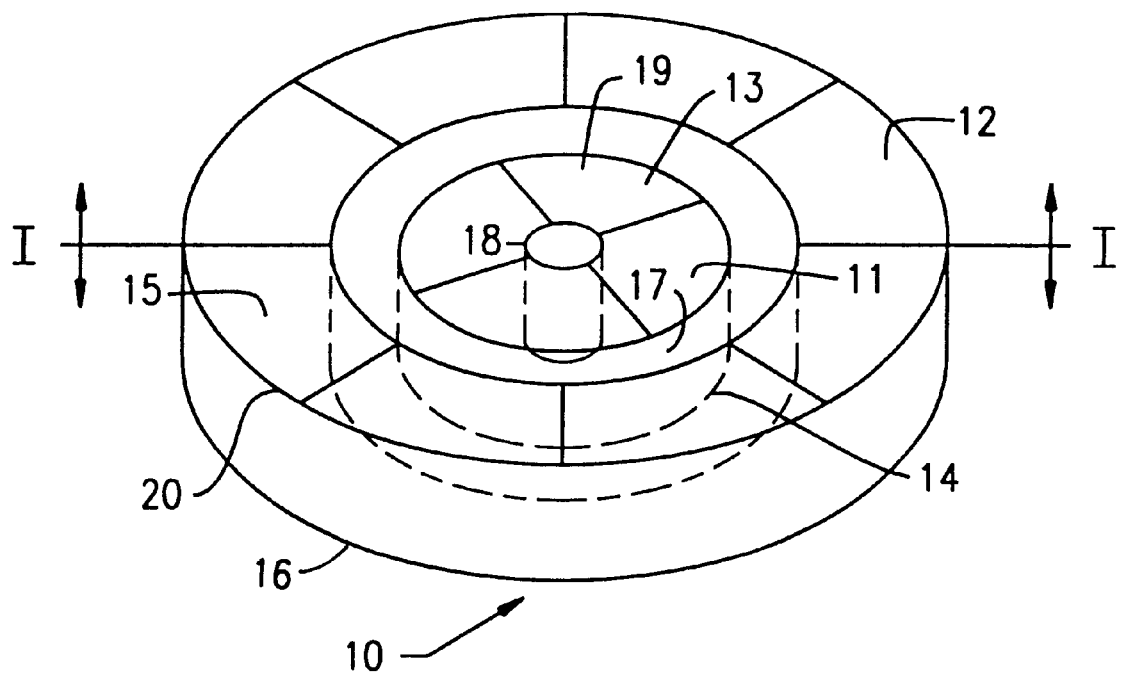
FIG. 1 is a pictorial perspective view of one segmented permanent magnet assembly according to the invention.
Figure 2:
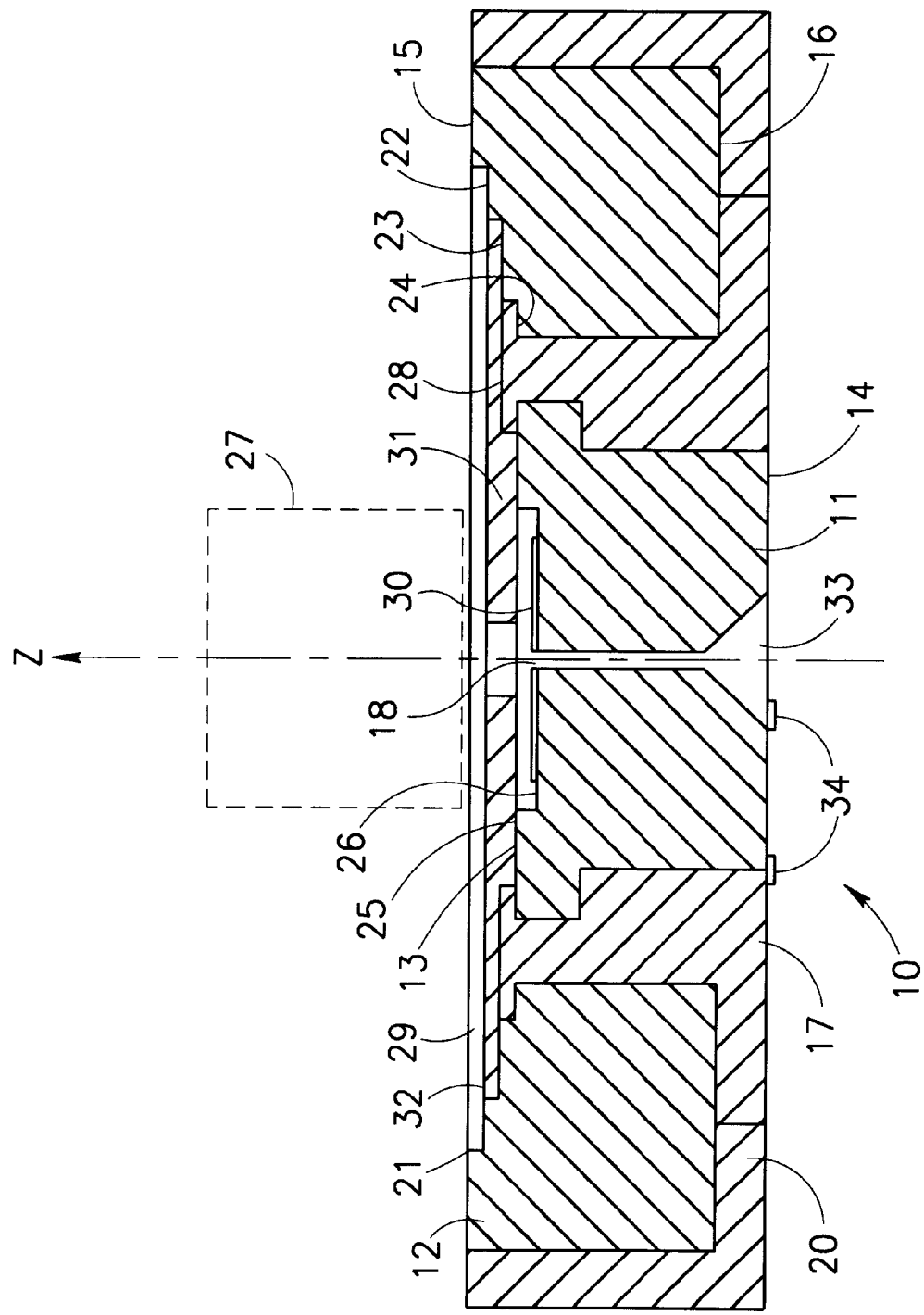
FIG. 2 is a half cross-sectional view through the line I—I in FIG. 1.

FIGS. 1 and 2, taken together, show pictorially one embodiment of the invention wherein a permanent magnet assembly 10 comprises inner and outer aligned annular permanent magnets 11 and 12 formed of Neodymium-Iron-Boron. The annular permanent magnets 11 and 12 are preferably concentric. The inner annular permanent magnet 11 has a first surface 13 lying in a first plane and a second surface 14 lying in a different plane, each plane being parallel to the x-y plane of the permanent magnet assembly 10. The outer annular permanent magnet 12 has a first surface 15 lying in a second plane and a second surface 16 lying in a different plane, each plane being parallel to the x-y plane of the permanent magnet assembly 10. The inner and outer annular permanent magnets 11 and 12 are interconnected by an intermediate annular band 17 of low permeability material which holds them with their north and south poles aligned in the same direction.

The complete structure comprising the inner annular permanent magnet 11, the outer annular permanent magnet 12 and the intermediate annular band 17 are supported by a support annular band 20 formed of low permeability material surrounding the outer annular permanent magnet 12. If desired, the support annular band 20 may be integral with the intermediate annular band 17, as shown in FIG. 2.

Referring particularly now to FIG. 2, a cross-section of the permanent magnet assembly 10 taken through the line I—I in FIG. 1, the first surface 15 of the outer annular permanent magnet is stepped such that a periphery 21 of the outer annular permanent magnet 12 is higher than successive intermediate portions 22, 23 and 24. Similarly, the first surface 13 of the inner annular permanent magnet 11 has a periphery 25 higher than an intermediate portion 26 thereof. The permanent magnet assembly 10 provides a volume 27 of substantially uniform magnetic field which is adjacent to its upper surface. Uniformity of the magnetic field in the volume 27 is based on the fact that any annular permanent magnet has one point where the derivative of the field strength with respect to the z-axis is zero (i.e. dB/dz=0), in a first direction perpendicular to the face of the magnet. In order to achieve the desired uniformity in the magnetic field of volume 27, the first surface 15 of the outer annular permanent magnet 12 is provided with steps 21, 22, 23, 24 and the first surface 13 of the inner annular permanent magnet 11 is provided with steps 25 and 26 constituting thereby a set of contiguous adjacent annular permanent magnets. Thus, each step produces an additional displaced point of zero derivative on the z-axis, riding on the ascending or descending parts of the curves describing the field strength generated by other steps. Consequently, the permanent magnet assembly 10 provides to the volume 27 a plurality of points for which dB/dz=0, such that the volume 27 of the magnetic field is substantially uniform.

A circular bore 18, its axis constituting the z-axis of the permanent magnet assembly 10, is formed in the inner annular permanent magnet 11 for allowing access from below therethrough of a medical instrument and for allowing an increased length of the medical instrument to protrude from the first surface 13 of the inner annular permanent magnet 11, when the permanent magnet assembly 10 is used in an MRT application. The circular bore 18 is provided with a conical recess 33 in the second surface 14 of the inner annular permanent magnet 11 of the permanent magnet assembly 10, for partially accommodating the medical instrument. Complete free access is allowed to the volume 27, when the volume is approached by the medical instrument from above.

In another embodiment of the invention, the inner annular permanent magnet 11 has a series of continuous steps such that the steps take the form of an incline. The incline is also possible on the steps of the outer annular permanent magnet 12.

Figure 3:
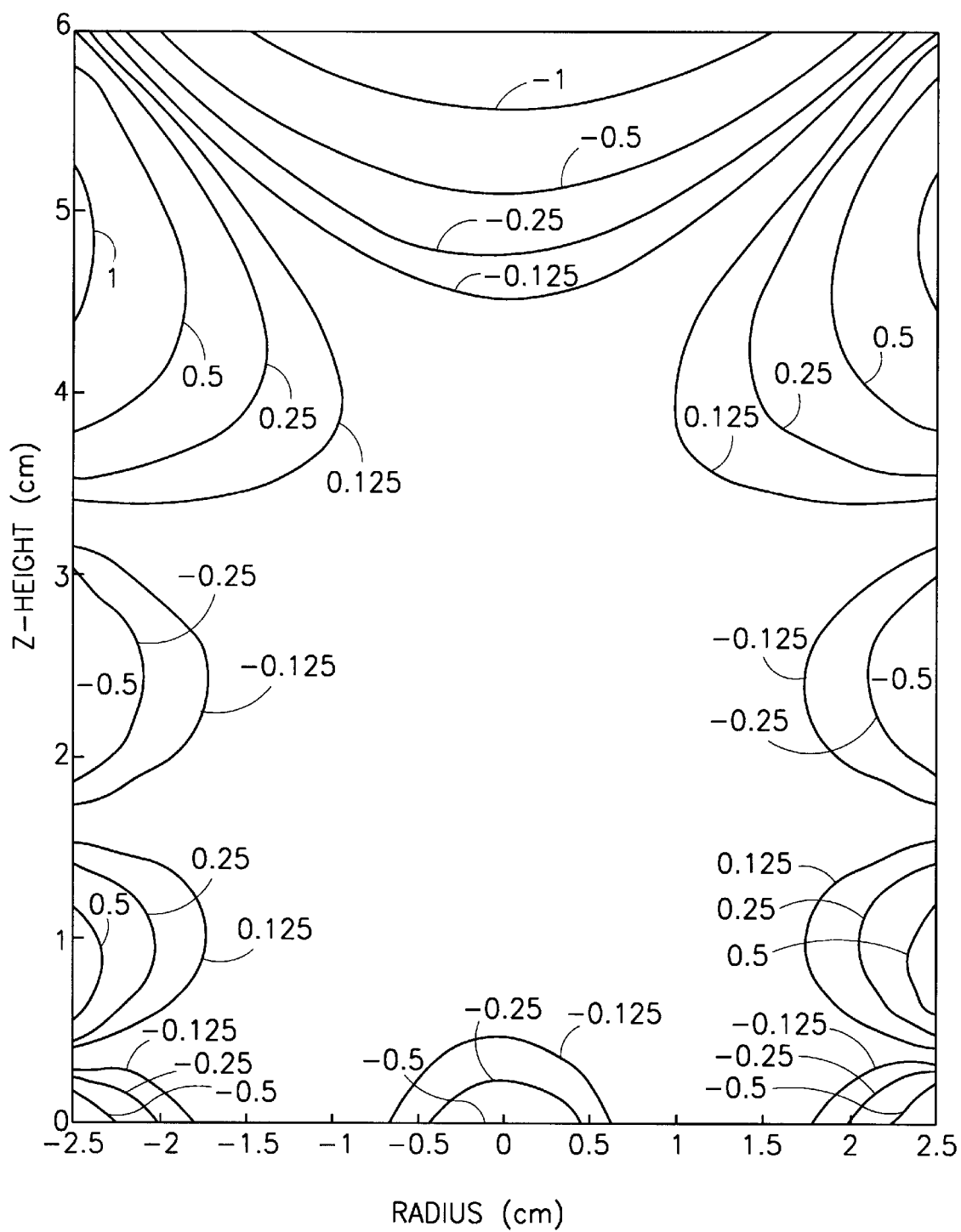
FIG. 3 is a representation of the two dimensional distribution of the magnetic field strength of the permanent magnet assembly of FIG. 1.

It has been found that a magnetic field with a uniformity of approximately 1000 ppm can be achieved prior to shimming, with a permanent magnet assembly 10 as shown in FIGS. 1 and 2. FIG. 3 shows the uniformity (in percentage) of the magnetic field generated by a 30 cm. diameter permanent magnet assembly. The volume 27 in which the uniformity is 1250 ppm or less is a cylinder adjacent to the upper face of the assembly 4.5 cm. in height, with a diameter of 2 cm. The field strength is 785 Gauss.

However, the uniformity of magnetic field strength of the volume 27 can be improved by means of shimming. There are standard shimming techniques, well-known to those skilled in the art of magnet design, referred to as passive shimming and active shimming.

Passive shimming can improve the magnetic field uniformity from orders of approximately 1000 ppm to orders of approximately 100 ppm. Active shimming can improve the magnetic field uniformity from orders of approximately 100 ppm to orders of approximately 10 ppm and less.

Passive shimming is achieved by disposing shaped fragments 30 of magnetic material of various polarities, of mumetal, or of soft iron on, for example, the intermediate portion 26 of the inner annular permanent magnet 11 underneath a multi-layer printed circuit board 32.

Active shimming is achieved by printing shim coils 31 on several layers of the separate layers of the multi-layer printed circuit board 32, the other layers housing the gradient and RF coils, used ordinarily in MRI systems. The multi-layer circuit board is seated in the recess 29, which is defined by the area between the intermediate portion 23 of the outer annular permanent magnet 12, the first surface 28 of the intermediate annular band 17 and above the first surface 13 of the inner annular permanent magnet 11. The multi-layer printed circuit board 32 is thus above the intermediate portion 26 of inner annular permanent magnet 11 and does not touch it. The uniformity of the magnetic field may be further improved by disposing fragments 34 of magnetic material of various polarities, mumetal or soft iron on, for example, the second surface 14 of the inner annular permanent magnet 11.

In another embodiment of the invention not shown in the drawings, the support annular band 20 and the intermediate annular band 17 are shaped so as to allow the coaxial annular permanent magnets 11 an 12 to be finely displaced and mutually offset along the common z-axis, so as to achieve shimming. In this case, each of the coaxial annular permanent magnets 11 and 12 is connected to a low permeability lower plate via a plurality of radially spaced-apart adjustment screws, attached to and cooperating with the annular permanent magnets 11 and 12. Thus, the turning of the screws a small amount in either clockwise or counterclockwise direction moves the corresponding annular permanent magnet (i.e. 11 or 12) toward or away from the low permeability lower plate and consequently corrects the non-uniformity in the volume 27 of uniform magnetic field to a desired degree.

The permeability of the annular permanent magnets 11 and 12, is temperature dependent so that temperature control can be a method of shimming. A deviation of 1° C. in the magnet temperature generates a change of 1000 ppm in the magnetic field strength. Each annular permanent magnet 11 and 12 has a temperature stabilization means for maintaining a substantially constant temperature of the respective permanent magnet and for varying it thereof for achieving shimming. The means consists of a heater and of a feedback circuit which controls the temperature.

It will be appreciated that modifications to the basic structure of the permanent magnet assembly 10 will be apparent to those skilled in the art, without departing from the spirit of the invention. For example, it is understood that other annular permanent magnet assemblies besides annular permanent magnets 11 and 12 may be employed. Also the size of the annular permanent magnets can vary according to the need.

Additional annular permanent magnets can be inserted between the inner and outer annular permanent magnets 11 and 12, preferably such that an intermediate support means of low permeability material is inserted between each adjacent annular permanent magnet. However, in the extreme embodiment where an external dimension of an internal annular permanent magnet is equal to an internal dimension of an adjacent, external annular permanent magnet, so that the two annular permanent magnets are contiguous, the permanent magnet assembly 10 behaves as though the two contiguous annular permanent magnets are a single structure. In either case, the desired volume 27 of uniform magnetic field is still achieved.

A common problem with magnets is the generation of eddy currents. Eddy currents are induced by momentarily changing the magnetic field as the gradient field is formed. The eddy currents in turn produce a separate magnetic field in the volume 27 of uniform magnetic field. In order to reduce eddy currents, both the inner and outer annular permanent magnets 11 and 12 are formed of segments 19, each of which is permanently magnetized in a known manner and then attached to a neighboring segment, using a non-conductive glue.

Further, it is possible that local heating could be problematic, thus the intermediate annular band 17 may be formed of high thermal conductivity material so as to dissipate heat and reduce heat buildup. In an embodiment where the intermediate annular band 17 is itself formed of electrically conductive material, it too may be slotted radially so as to reduce eddy currents.

Figure 4:
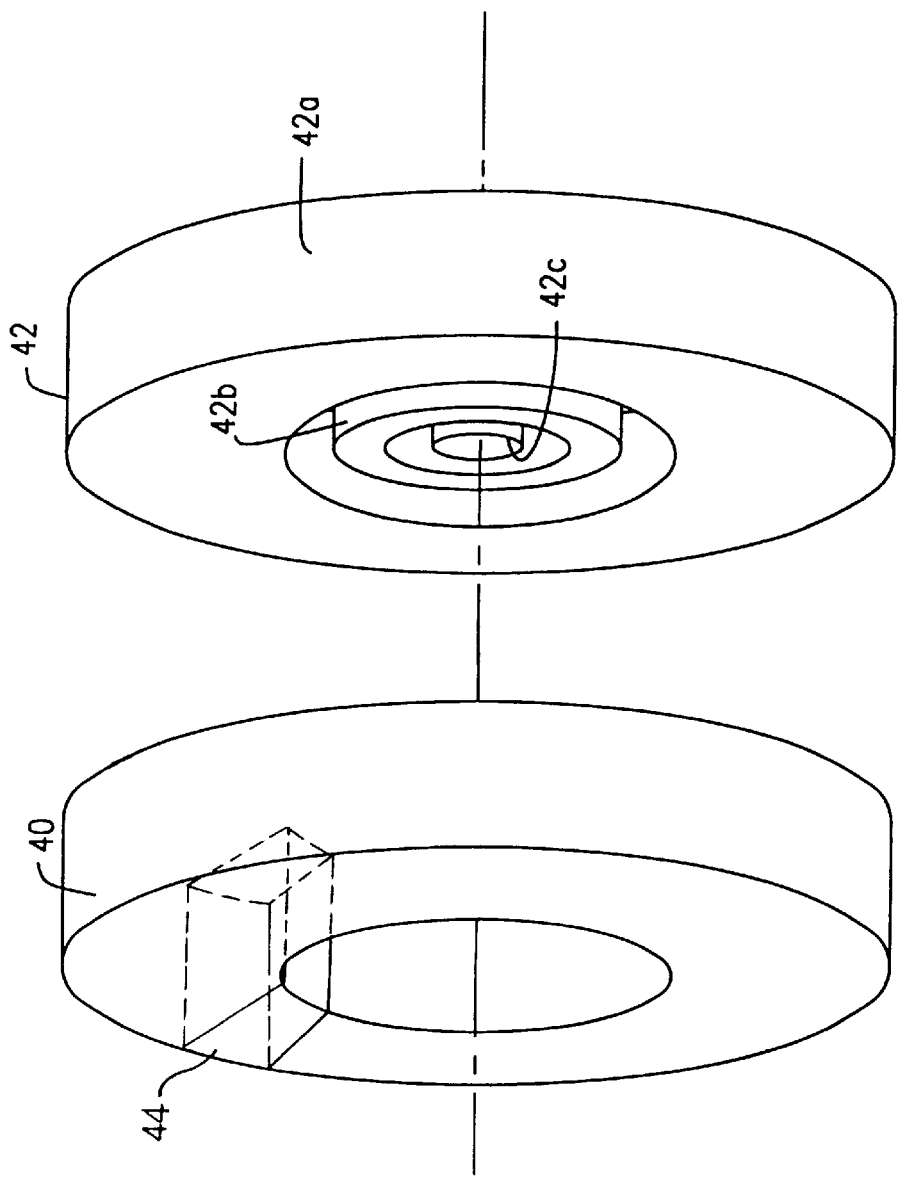
FIG. 4 is a pictorial representation of a first and a second permanent magnet assembly.

Another way to use the permanent magnet assemblies is in opposed pairs, to form the uniform magnetic field therebetween. FIG. 4 is a pictorial representation of a set of first and second permanent magnet assemblies 40 and 42 each consisting of three concentric annular permanent magnets 42a, 42b, 42c and 40a, 40b, 40c (not shown in the drawing). Each permanent magnet assembly is formed of segments 44, electrically insulated from a neighboring segment so as to reduce eddy currents.

Figure 5:
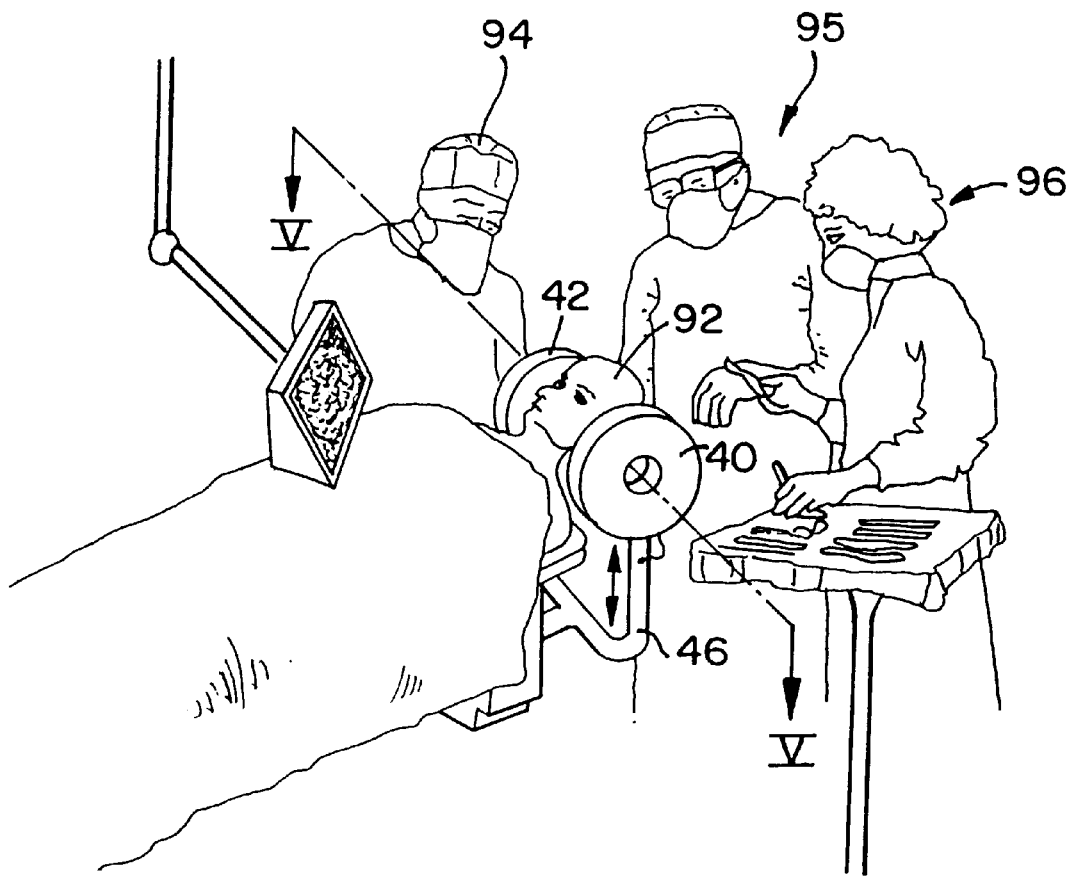
FIG. 5 is a pictorial perspective view of the first and second permanent magnet assemblies connected via a frame used for brain surgery.

FIG. 5 shows pictorially details of the pair of permanent magnet assemblies 40 and 42 joined together via the frame 46 being shaped for imaging a patient's brain 92, as manipulated by a plurality of surgeons 94 and 95 and a nurse 96. The pair of permanent magnet assemblies 40 and 42 joined together via a frame 46 define a region having a volume 27 of substantially uniform magnetic field, between the pair of permanent magnet assemblies 40 and 42.

Figure 6:
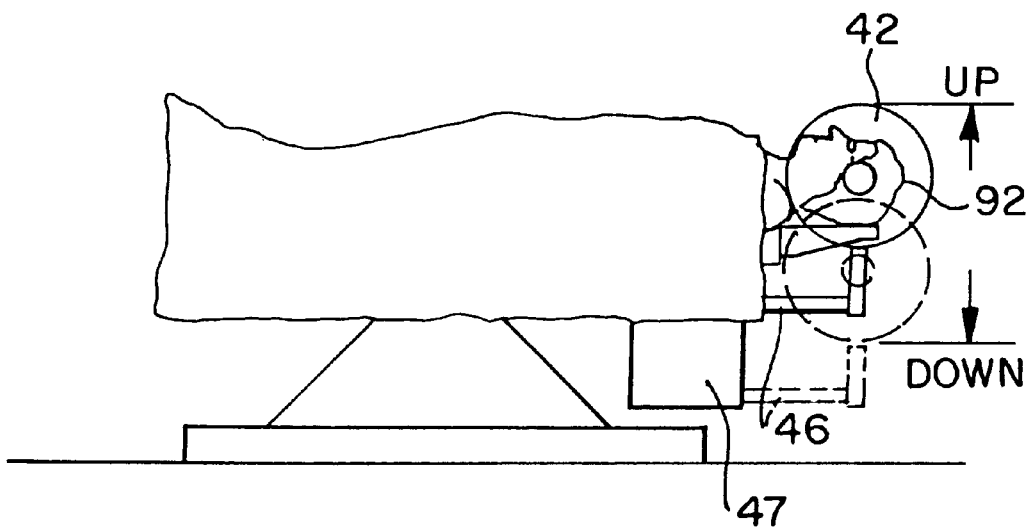
FIG. 6 is a pictorial perspective view of the first and second permanent magnet assemblies shown functionally in FIG. 5, used for performing composite imaging.

FIG. 6 is a pictorial side view of the pair of permanent magnet assemblies 40 and 42 connected via a frame 46, shown pictorially in FIG. 5, used for performing composite imaging. The pair of permanent magnet assemblies 40 and 42 may be moved as a whole in the three directions x, y, and z by a MRI compatible motor control unit 47, to shift the region of volume 27 of uniform magnetic field and thus perform MRI and/or MRT on different regions of the patient's brain 92. Thus, the volume 27 of uniform magnetic field is shifted in relation to a patient placed between the pair of permanent magnet assemblies 40 and 42. In use, the pair of permanent magnet assemblies 40 and 42 connected via the frame 46 is placed in a first position to produce a first image over a small field of view. The pair of permanent magnet assemblies 40 and 42 connected via the frame 46 is then moved by the motor control unit 47, for example in the up and down directions, so as to produce a series of spatially offset images. These separate spatially offset images are then combined to form a composite image, having a larger field of view.

Figure 7:
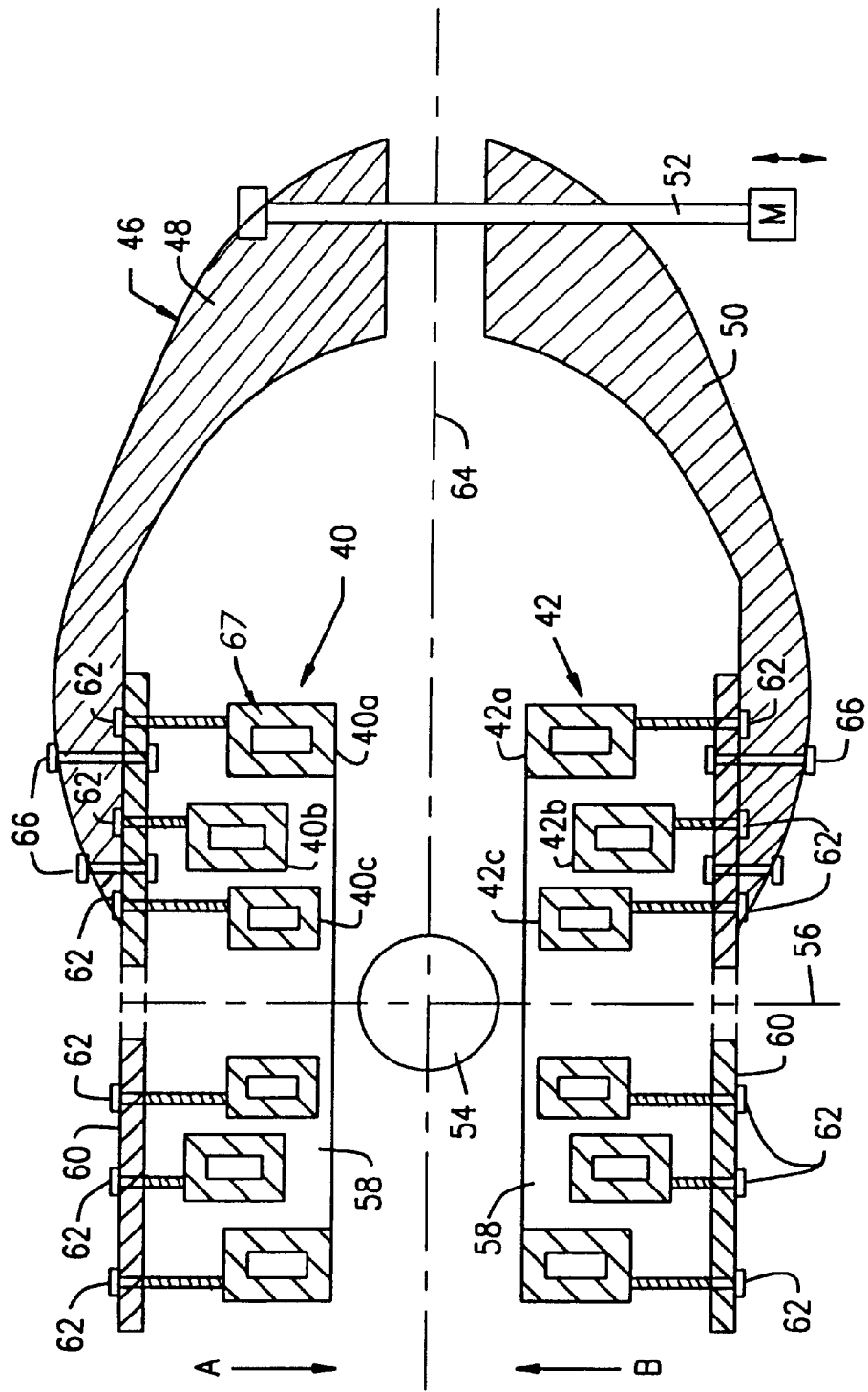
FIG. 7 is a cross-sectional view through the first and second permanent magnet assemblies and connecting means of FIG. 5.

FIG. 7 is a detailed cross-sectional view through the pair of permanent magnet assemblies 40 and 42 along the line V—V in FIG. 5. The frame 46 comprises a set of two symmetrically mounted jaws 48 and 50 joined at an end by a screw 52. An MRI compatible motor designated M is attached to the screw 52 to provide displacement of each of the permanent magnet assemblies 40 and 42 as a whole in an axial direction, to bring the permanent magnet assemblies 40 and 42 either closer together or further apart, for shimming purposes.

Each of the permanent magnet assemblies 40 and 42 includes a plurality of coaxial annular permanent magnets 40a, 40b, 40c and 42a, 42b, 42c which are designed to provide the required volume 27 of uniform magnetic field within a region 54 between the pair of permanent magnet assemblies 40 and 42. Each of the annular permanent magnets 40a, 40b, 40c and 42a, 42b, 42c is enclosed in a low permeability material casing 67. It will be noted that FIG. 7 shows only three coaxial annular permanent magnets, for the sake of illustration and description.

Each of the coaxial annular permanent magnets 40a, 40b, 40c and 42a, 42b, 42c is coaxial with a common axis 56 of the corresponding pair of permanent magnet assemblies 40 and 42, respectively. However, the coaxial annular permanent magnets 40a, 40b, 40c and 42a, 42b, 42c themselves are mutually offset along the common axis 56.

The contribution of each annular permanent magnet to the overall field strength combines to generate a plurality of locations of zero derivative in the z-direction allowing the magnetic field in the volume to be made uniform to within a defined tolerance. The overall field strength along the z-axis 56 of each permanent magnet assembly 40 and 42 is given by:

$$B(z) = \frac{\mu_0 \Phi}{2} \sum_i \mu_i \left( \frac{\Delta z_i + h_i/2}{\sqrt{(\Delta z_i + h_i/2)^2 + b_i^2}} - \frac{\Delta z_i - h_i/2}{\sqrt{(\Delta z_i - h_i/2)^2 + b_i^2}} - \frac{\Delta z_i + h_i/2}{\sqrt{(\Delta z_i + h_i/2)^2 + a_i^2}} + \frac{\Delta z_i - h_i/2}{\sqrt{(\Delta z_i - h_i/2)^2 + a_i^2}} \right)$$

where:

$\Delta z_i = z - z_{0i}$ is the transverse separation, along the symmetry axis 56, of z and $z_{0i}$, a point located midway between the upper and lower surfaces of the $i^{th}$ annular permanent magnet $\Phi$ is the magnetization $\mu_0$ the permeability of air $\mu_i$ is the permeability of the $i^{th}$ annular permanent magnet $a_i$ is the inner radius of the $i^{th}$ annular permanent magnet $b_i$ is the outer radius of the $i^{th}$ annular permanent magnet $h_i$ is the height of the $i^{th}$ annular permanent magnet the direction of the z axis for each permanent magnet assembly is towards the volume 27 of uniform magnetic field. The overall field strength is a superposition of the field strengths generated by each assembly.

Each of the coaxial annular permanent magnets 40a, 40b, 40c and 42a, 42b, 42c is fixed to an outer casing 60 via a plurality of radially spaced apart set screws 62, attached to the magnets enclosures 67, cooperating with the respective coaxial enclosures 67 of the annular permanent magnets 42a, 42b, and 42c, for achieving shimming of the permanent magnet assembly 42. It is apparent, as noted above, that the coaxial annular permanent magnets 42a, 42b, 42c are mutually offset along the common axis 56 so as to achieve shimming. Thus, turning of the set screws 62 a small amount in either clockwise or counter-clockwise direction moves the corresponding coaxial annular permanent magnet (i.e. 42*a*, 42*b*, 42*c* etc.) toward or away from the outer casing 60 of the permanent magnet assembly 42 and consequently corrects the non-uniformity in the region 54 of volume 27 of uniform magnetic field to a desired degree.

The free end of the jaws 48 and 50 is fixed to the outer casing 60 of the permanent magnet assemblies 40 and 42 by means of a plurality of fixing bolts 66. The whole structure 46 can be translated along the x, y and z axis by the motor control unit 47 (not shown). Moreover, each of the jaws 48 and 50 may be rotated away from its opposing jaw by the motor control unit 47, around an axis passing along screw 52, to allow the surgeon to have complete free access to one side of the patient. The bolts 66 may also be displaced, so that the respective pair of permanent magnet assemblies 40 and 42 may be moved in the direction of arrows A and B and thus accomplish shimming.

Figure 8:
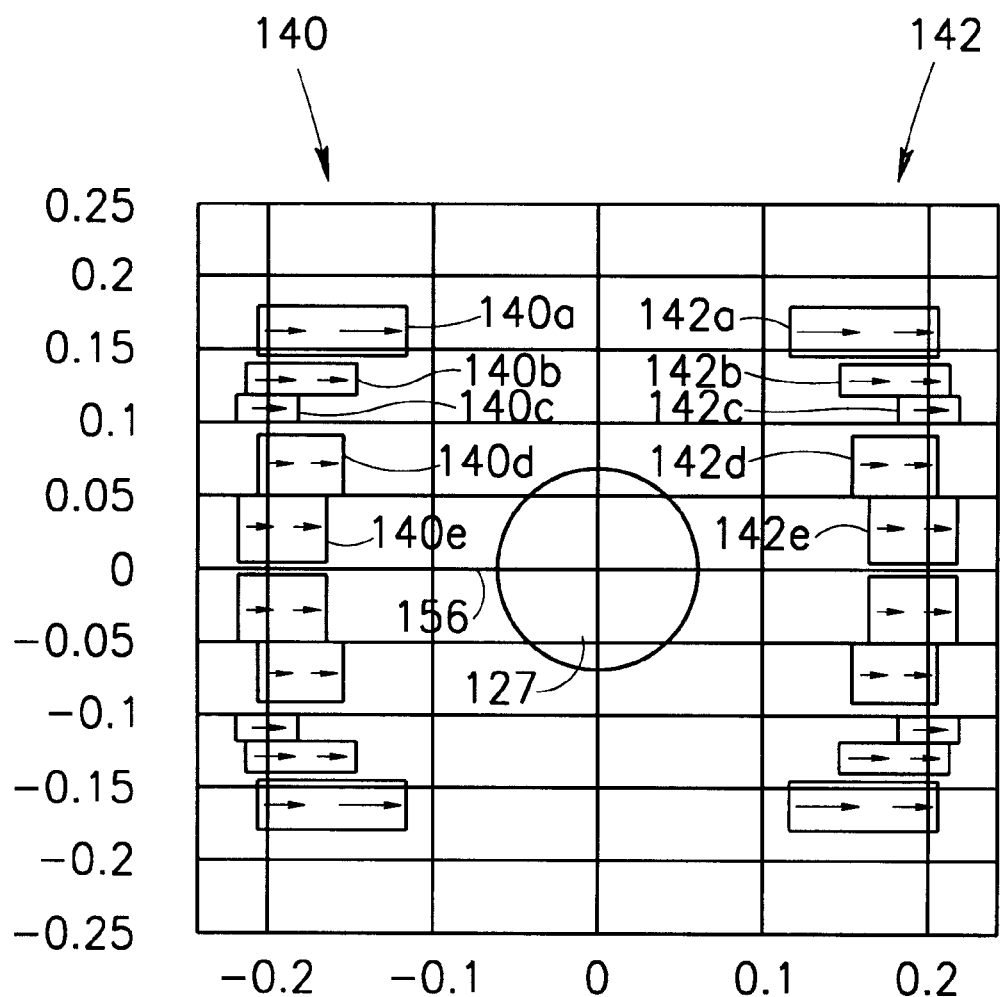
FIG. 8 is a schematic representation of first and second permanent magnet assemblies in which each permanent magnet assembly has five annular ring magnets.

FIG. 8 is a schematic representation of an embodiment of the invention including five coaxial annular permanent magnets 140*a*, 140*b*, 140*c*, 140*d*, 140*e* and 142*a*, 142*b*, 142*c*, 142*d*, 142*e* of the pair of permanent magnet assemblies 140 and 142. The dimensions of the five coaxial annular permanent magnets are shown in meters. The magnetic polarity of the coaxial annular permanent magnets creates a volume 127 of homogenous magnetic field.

Inasmuch as the pair of permanent magnet assemblies 140 and 142 are identical in the embodiment thus far as described in FIG. 7, only one permanent magnet assembly containing five coaxial annular permanent magnets will be described in detail. However, it is understood that the pair of permanent magnet assemblies 140 and 142 need not be identical. Rather, the pair of permanent magnet assemblies 140 and 142 can have an unequal number of annular permanent magnets.

Thus, in FIG. 8, the coaxial annular permanent magnets 140, 140*b*, 140*c*, 140*d*, 140*e* in the permanent magnet assembly 140 may be finely displaced for shimming either towards or away from the complementary coaxial annular permanent magnets 142*a*, 142*b*, 142*c*, 142*d*, and 142*e* in the opposing permanent magnet assembly 142 along the common axis 156. An air gap of approximately 5 millimeters is provided between the adjacent coaxial annular permanent magnets 140*a* and 140*b* with an increased air gap of approximately 10 millimeters provided between the adjacent coaxial annular permanent magnets millimeters 140*c* and 140*d*. The remaining adjacent coaxial annular permanent magnets 140*b*, 140*c* and 140*d*, 140*e* are contiguous. Further, the overall average displacement between the pair of permanent magnet assemblies 140 and 142 is approximately 25 cm. and their approximate radius is 18 cm. The two opposing magnets weigh together 120 kg. The diameter of the spherical volume 127 of uniform magnetic field is 16 cm.

Figure 9:
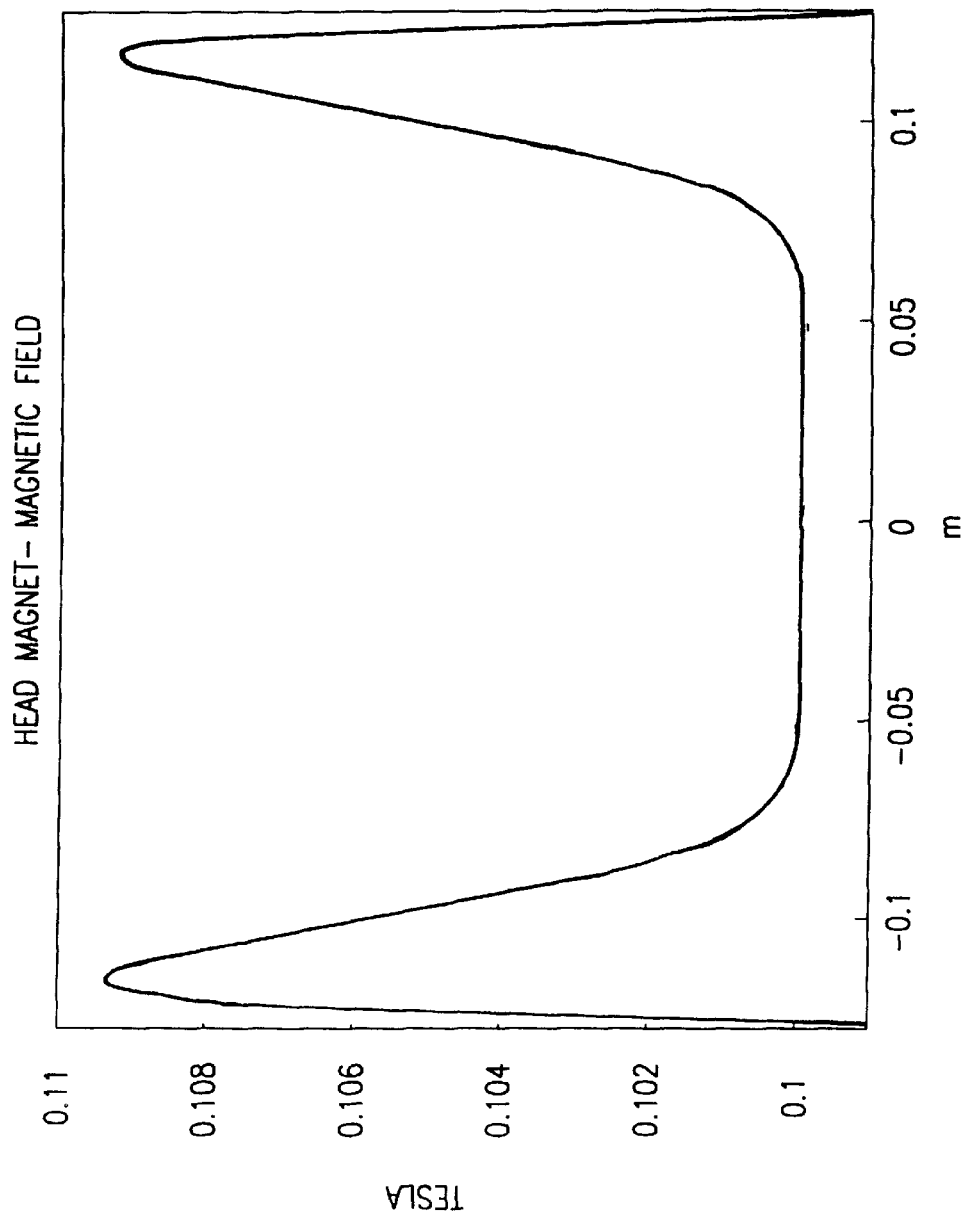
FIG. 9 is a graph showing the magnetic field strength as a function of displacement along the z-axis between the first and second permanent magnet assembly of FIG. 8.
Figure 10:
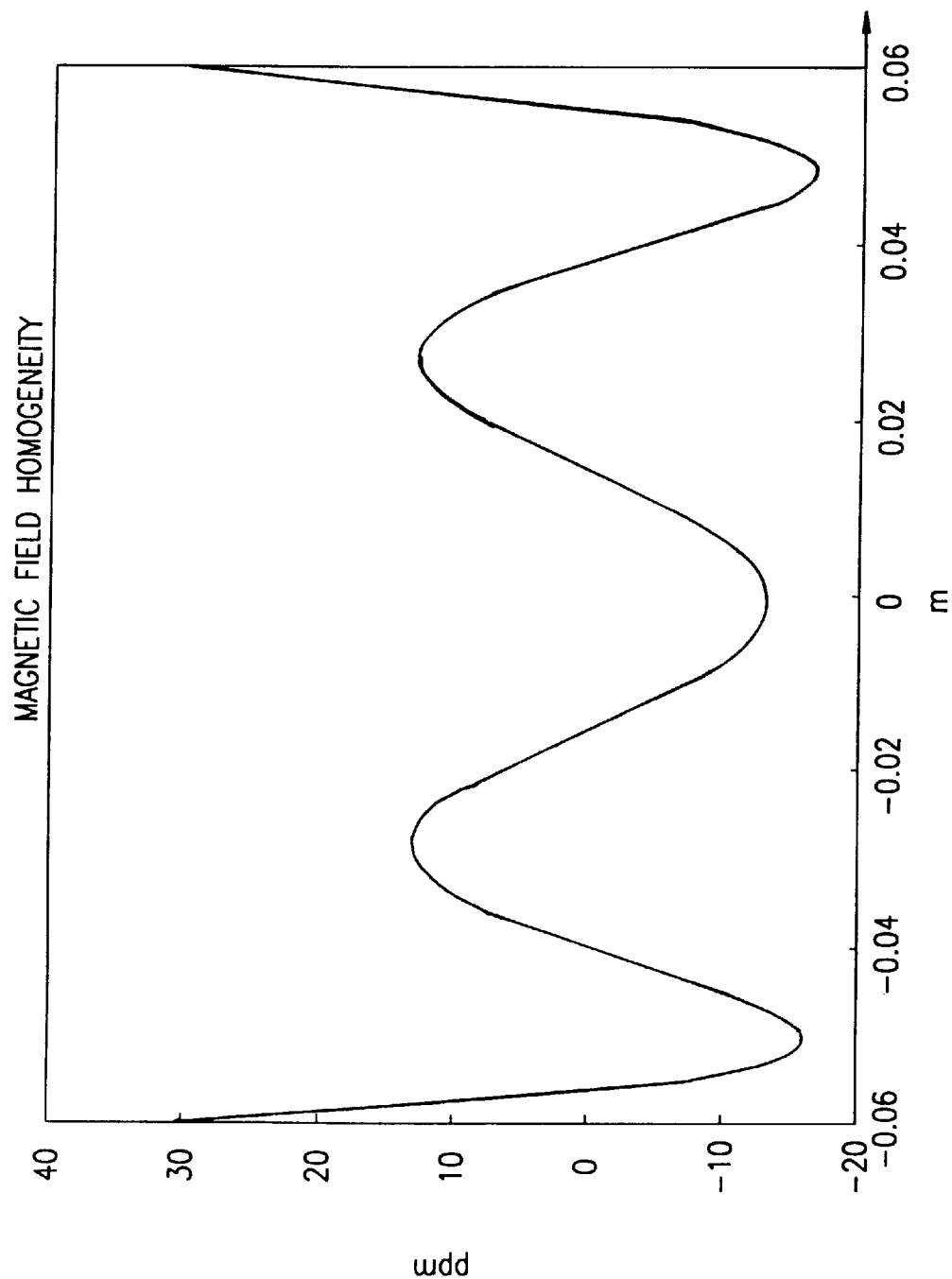
FIG. 10 is a graphical representation showing the deviation from uniform magnetic field along the z-axis between the first and second permanent magnet assembly of FIG. 8.

FIG. 9 is a graph showing magnetic field strength as a function of displacement along the z-axis, at a given value of y. It is seen that the field strengths of the opposing permanent magnet assemblies 40 and 42 superimpose so as to form a region 54 of a volume 27 of substantially homogenous magnetic field having a magnitude of approximately 1000 Gauss. FIG. 10 is a graphical representation of the magnetic field in volume 27 along the z-axis, showing the uniformity in ppm. The effect of superposition of curves having spaced apart maxima is illustrated.

As noted above, a particular design feature of the permanent magnet assembly 10 is the ease with which shimming may be used to achieve a volume 27 of very high magnetic field uniformity typically to within several ppm.

Figure 11:
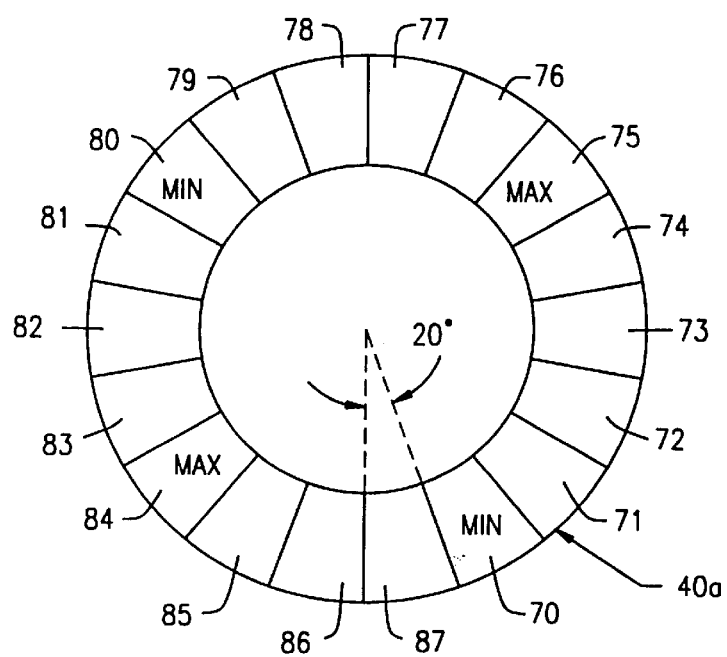
FIG. 11 shows schematically a detail of the segmented construction of the first and second permanent magnet assemblies, according to a preferred embodiment of the invention.

FIG. 11 shows schematically a detail of the construction of the coaxial annular permanent magnet 40*a*. Each coaxial annular permanent magnet comprises eighteen permanently magnetized segments 70 to 87 which are supplied in batches and are normally guaranteed by the manufacturer to have a peak to peak variation in magnetic field of 1%. The segments 70 to 87 each subtend an angle of 200 at the center of the coaxial annular permanent magnet 40*a* and are joined by an electrically non-conductive adhesive so as to reduce eddy currents, as explained above.

Owing to the slight difference in magnetic field between different segments 70 to 87 in each batch, it is often difficult to achieve a volume 27 of even a coarse magnetic field uniformity in the region 54 between a pair of opposing permanent magnet assemblies 40 and 42. It will be understood that at least a coarse magnetic field uniformity is a prerequisite to the fine tuning achieved using passive and active shimming.

Figure 12A:
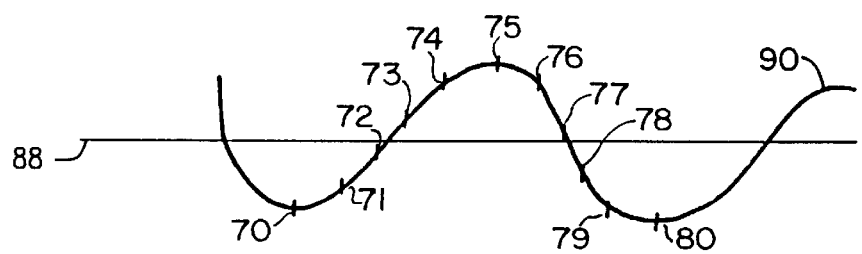
FIGS. 12a and 12b show graphically a preferred mutual disposition of opposing first and second permanent magnet assemblies having complementary magnetic field variations.
Figure 12B:
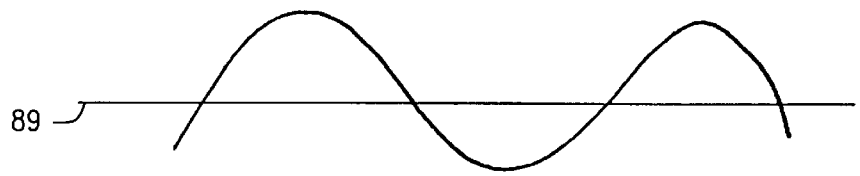

FIGS. 12*a* and 12*b* show graphically how such a volume 27 of coarse magnetic field uniformity is achieved, notwithstanding the inherent variation in magnetic field of different segments 70 to 87. The magnetic field of different segments 70 to 87 is measured and adjacent segments are selected from the batch having slightly different field strengths so as to follow a substantially cyclic curve 90. Thus, as shown in FIGS. 11 and 12*a*, the particular segments 70 and 80 have a minimum magnetic field as compared to segment 85 which has a maximum magnetic field. The segments from 70 to 75 have increasing magnetic fields following the cyclic curve 90 in contrast to segments from 75 to 80 which have decreasing magnetic fields following the cyclic curve 90. Each of the pair of permanent magnet assemblies 40 and 42 is constructed according to this approach and are then opposed to one another in anti-phase such that the relationship of the corresponding magnetic fields of the pair of permanent magnet assemblies 40 and 42 corresponds to the two anti-phase cyclic curves shown in FIGS. 12*a* and 12*b*. The variations in magnetic field from its average value as described by lines 88 and 89 along the two cyclic curves then exactly cancel each other out, such that a region 54 between the pair of permanent magnet assemblies 40 and 42 has a volume 27 of uniform magnetic field.

It will be appreciated by those skilled in the art, that while the MRI magnets disclosed hereinabove have many advantages useful in interventional magnetic resonance imaging (IMRI) applications such as compactness, relatively small weight and improved maneuvrability relative to an imaged organ or body part, in certain applications it may be desirable to increase the strength of the main magnetic field within the imaging volume. This may be achieved by constructing the annular permanent magnets of the magnet assemblies disclosed hereinabove from a permanent magnetic material having a higher magnetization.

An alternative approach for increasing the magnetic field strength may be to provide a path for closing the magnetic flux lines by providing a suitable yoke made from a ferromagnetic material.

Figure 13:
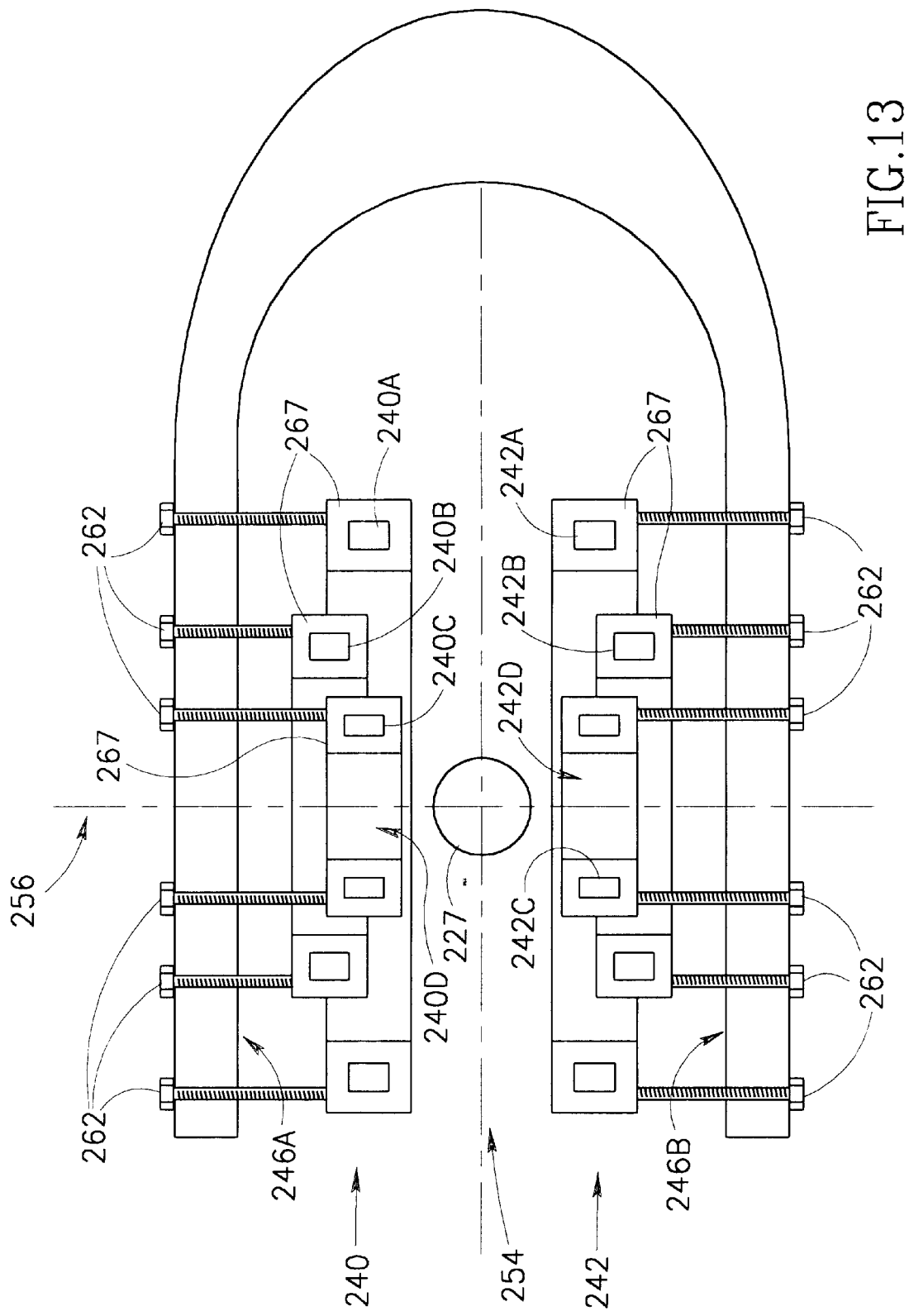
FIG. 13 is a schematic cross-sectional view of a yoked magnet including first and second permanent magnet assemblies adjustably connected to a ferromagnetic yoke, in accordance with another preferred embodiment of the present invention.

Reference is now made to FIG. 13 which is a schematic cross-sectional view of a yoked magnet including first and second permanent magnet assemblies adjustably connected to a ferromagnetic yoke, in accordance with another preferred embodiment of the present invention.

The yoked magnet includes a pair of permanent magnet assemblies 240 and 242 which are adjustably attached to a ferromagnetic yoke 246. The ferromagnetic yoke 246 is a U-shaped or C-shaped member which is preferably made from soft iron but may also be made of any other suitable ferromagnetic material such as soft iron, a iron-silicon alloy, a nickel-iron alloy, an iron-cobalt-vanadium alloy, soft ferrite, or the like.

Each of the permanent magnet assemblies 240 and 242 includes a plurality of coaxial annular permanent magnets 240A, 240B, 240C and 242A, 242B, 242C which are designed to provide the required volume 227 of uniform magnetic field within a region 254 between the pair of permanent magnet assemblies 240 and 242. Each of the annular permanent magnets 240A, 240B, 240C and 242A, 242B, 242C is enclosed in a low permeability material casing 267.

It is noted that, while FIG. 13 illustrates only three coaxial annular permanent magnets within each of the permanent magnet assemblies 240 and 242, the permanent magnet assemblies of the present invention may be implemented using a different number of coaxial annular permanent magnets within each of the permanent magnet assemblies 240 and 242. Practically, each of the permanent magnet assemblies 240 and 242 may include 2–6 coaxial annular permanent magnets. A higher number of coaxial annular permanent magnets may be also be used but this may increase the cost of the magnet and difficulty of fine-tuning and shimming the magnet.

It is further noted that while the innermost annular permanent magnets 240C and 242C are shaped as annular structures having two hollow passages 240D and 242D, respectively, therewithin, the innermost permanent magnets may also be shaped as two solid circular disks made of permanent magnetic material and having no passages passing therethrough (not shown in FIG. 13).

Each of the coaxial annular permanent magnets 240A, 240B, 240C and 242A, 242B, 242C is coaxial with a common axis 256 of the corresponding pair of permanent magnet assemblies 240 and 242, respectively. However, the coaxial annular permanent magnets 240A, 240B, 240C and 242A, 242B, 242C themselves are mutually offset along the common axis 256.

The z axis for each of the permanent magnet assemblies 240 and 242 coincides with the common axis 256 which is the axis of radial symmetry of the volume 227 of uniform magnetic field. The overall field strength is a superposition of the field strengths generated by each of the assemblies 240 and 242.

Each of the coaxial annular permanent magnets 240A, 240B, 240C and 242A, 242B, 242C is movably attached to the ferromagnetic yoke 246 via a plurality of radially spaced apart set screws 262, attached to the magnet enclosures 267, cooperating with the respective coaxial enclosures 267 of the annular permanent magnets 242A, 242B, and 242C, for achieving shimming of the permanent magnet assembly 242. It is apparent, as noted above, that the coaxial annular permanent magnets 242A, 242B, 242C are mutually offset along the common axis 256 so as to achieve shimming. Thus, turning of the set screws 262 a small amount in either clockwise or counter-clockwise direction moves the corresponding coaxial annular permanent magnet (i.e. 242A, 242B, 242C etc.) toward or away from an inner surface 246B of the ferromagnetic yoke 246 and consequently corrects the non-uniformity of the magnetic field in the volume 227 of uniform magnetic field to a desired degree.

Similarly, turning the screws 262, cooperating with the respective coaxial enclosures 267 of the annular permanent magnets 240A, 240B, and 240C, clockwise or counterclockwise may be performed moves the corresponding coaxial annular permanent magnet (i.e. 240A, 240B, 240C etc.) toward or away from an inner surface 246A of the ferromagnetic yoke 246 and consequently corrects the non-uniformity of the magnetic field in the volume 227 of uniform magnetic field to a desired degree.

It is noted that besides serving for changing the offset of the coaxial annular permanent magnets of a permanent magnet assembly from each other along the axis 256, the screws 262 may also be used for shimming by slightly tilting any of the annular permanent magnets 240A, 240B, 240C and 242A, 242B, 242C at an angle with respect to the parallel surfaces 246A and 246B of the yoke 246. This may be achieved by advancing (or retracting) some of the screws 262 attached to the same annular permanent magnet in a direction parallel to the axis 256 by unequal amounts. Tilting may also be achieved by turning one or more of the screws 262 of an annular permanent magnet clockwise and one or more of the remaining screws of the same annular permanent magnet counterclockwise. It is noted that many different ways for such tilting are possible and that such tilting of an object by adjusting screws is well known in the mechanical arts and is not discussed in detail hereinafter. The tilting may be used for compensating for small deviations from uniformity of the magnetization of an annular permanent magnet which may occur during manufacturing.

The direction of magnetization (not shown) of both of the annular permanent magnets within a single opposing pair of annular permanent magnets (i.e. the pairs 240A and 242A, 240B and 242B and 240C and 242C) is identical. However, the direction of magnetization of different opposing pairs of annular permanent magnets may or may not be identical depending, inter alia, on the particular design and dimensions of the permanent magnet assemblies and on required degree of homogeneity of the magnetic field in the volume 227.

The individual annular permanent magnets may be constructed as a single piece of permanently magnetized material. However, preferably, the annular permanent magnets are constructed from segments which are glued or attached together by a non-electrically conducting glue or material for reducing the development of eddy currents in the annular permanent magnets induced by the currents developed by the gradient coils (not shown) or RF coils and/or active shimming coils (not shown). The details of construction of the annular permanent magnets and of the permanent magnet assemblies 240 and 242 are as disclosed in detail hereinabove or according to any of the methods for construction of annular permanent magnets disclosed in U.S. patent application to Zuk et al. et al., Ser. No. 09/161,336 filed Sep. 25, 1998, titled "MAGNETIC APPARATUS FOR MRI", the entire specification of which is incorporated herein by reference, and in U.S. patent application to Katznelson et al., Ser. No. 09/274,671 filed Mar. 24, 1999, titled "HYBRID MAGNETIC APPARATUS FOR USE IN MEDICAL APPLICATIONS", the entire specification of which is incorporated herein by reference.

The advantage of the MRI magnet disclosed in FIG. 13 is that it provides within the volume 227 a magnetic field that is stronger than the magnetic field provided by a magnet having identical magnet assemblies but lacking a ferromagnetic yoke. This increase in the magnetic field strength is due to the path for closing of the magnetic flux lines (not shown) of the permanent magnet assemblies 240 and 242 provided by the ferromagnetic yoke 246. Such an increase in the magnetic field strength improves the resolution of the MRI images obtained using the magnet of FIG. 13 and reduces the time required for image acquisition which is particularly desirable during the performance of interventional MRI.

Figure 14:
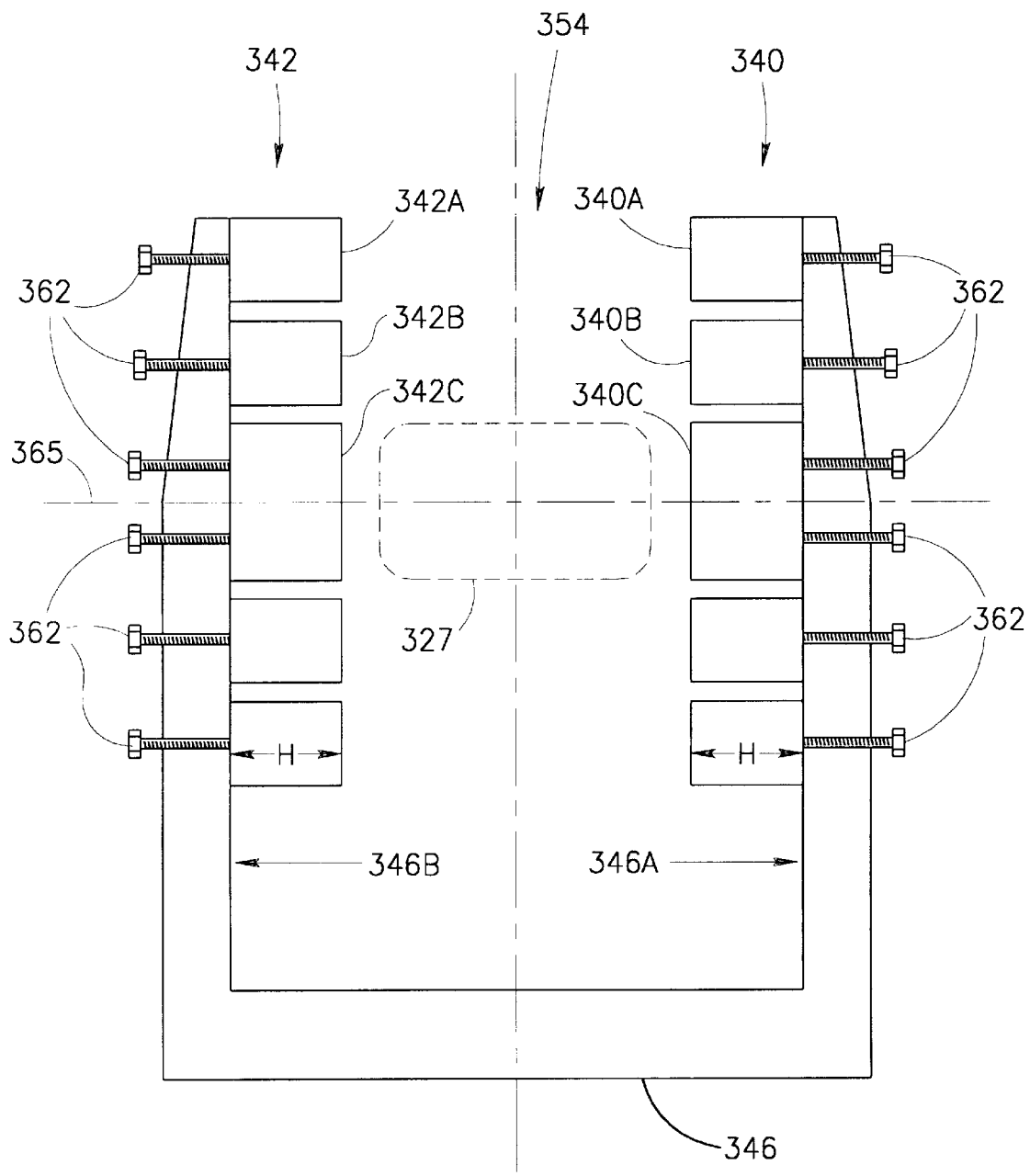
FIG. 14 is a schematic cross-sectional view of a yoked magnet including first and second permanent magnet assemblies adjustably connected to a ferromagnetic yoke, in accordance with yet another preferred embodiment of the present invention.

Reference is now made to FIG. 14 which is a schematic cross-sectional view of a yoked magnet including first and second permanent magnet assemblies adjustably connected to a ferromagnetic yoke, in accordance with yet another preferred embodiment of the present invention. The yoked magnet includes a pair of permanent magnet assemblies 340 and 342 which are adjustably attached to a ferromagnetic yoke 346. The ferromagnetic yoke 346 is a generally U-shaped member which is preferably made from soft iron but may also be made of any other suitable ferromagnetic material such as iron-silicon alloys, nickel-iron alloys, iron-cobalt vanadium alloys (FeCoV), the alloy Permendum, soft ferrite, and the like.

Each of the permanent magnet assemblies 340 and 342 includes a plurality of coaxial permanent magnets 340A, 340B, 340C and 342A, 342B, 342C which are designed to provide the required volume 327 of uniform magnetic field within a region 354 between the pair of permanent magnet assemblies 340 and 342. The permanent magnets 340A, 340B of the magnet assembly 340 and the permanent magnets 342A, 342B of the magnet assembly 342 are annular (circular ring shaped or polygonal ring shaped having N sides having a sufficiently large number of sides to achieve a specified homogeneity of the magnetic field within the volume 327) coaxial permanent magnets. The coaxial permanent magnets 340C and 342C of the permanent magnet assemblies 340 and 342, respectively, are coaxial cylindrical (or disk like) permanent magnets or axially symmetric right regular polygonal prism shaped permanent magnets (not shown in FIG. 14) having a sufficiently large number of sides to achieve a specified homogeneity of the magnetic field within the volume 327. Practically, for such polygonal prisms the number of sides N should be N≧8. However, other values of N may be used depending, inter alia, on the required degree of homogeneity of the magnetic field within the volume 327 and on manufacturing considerations. The details of the structure and construction of such cylindrical, prismatic, annular and polygonal annular permanent magnets is disclosed in detail, inter alia, in U.S. patent application to Panfil and Katznelson, Serial No. 09/295,814, assigned to the assignee of the present application, filed Feb. 9, 1999, titled "A METHOD FOR DESIGNING OPEN MAGNETS AND OPEN MAGNETIC APPARATUS FOR USE IN MRI/MRT PROBES".

It will be noted that while FIG. 14 illustrates only three coaxial annular permanent magnets within each of the permanent magnet assemblies 340 and 342, the permanent magnet assemblies of the present invention may be implemented using a different number of coaxial annular permanent magnets within each of the permanent magnet assemblies 340 and 342. Practically, each of the permanent magnet assemblies 340 and 342 may include 2–6 coaxial permanent magnets. A higher number of coaxial permanent magnets may be also used but this may increase the cost of the magnet and difficulty of fine-tuning and shimming the magnet.

The z axis for each of the permanent magnet assemblies 340 and 342 coincides with the common axis 356 which is the axis of radial symmetry of the volume 327 of uniform magnetic field. The overall field strength is a superposition of the field strengths generated by each of the assemblies 340 and 342.

Each of the coaxial permanent magnets 340A, 340B, 340C and 342A, 342B, 342C is coaxial with a common axis 356 of the corresponding pair of permanent magnet assemblies 340 and 342, respectively. Due to symmetry requirements, the dimension along the axis 356 of each of the two opposed permanent magnets within each of the magnet pairs opposed coaxial permanent magnet pairs 340A and 342A, 340B and 342B, and 340C and 342C must be equal. For example, the heights H (extending along the axis 356) of each of the opposing coaxial permanent magnets 340A and 342A must be equal to each other, the heights H (extending along the axis 356) of each of the opposing coaxial permanent magnets 340B and 342B must be equal to each other and so forth. However, while in the preferred embodiment illustrated in FIG. 14 all of the coaxial permanent magnets 340A, 340B, 340C and 342A, 342B, 342C have an equal height H, in accordance with other preferred embodiments of the present invention, the heights of the permanent magnets within each of the opposed coaxial permanent magnet pairs 340A and 342A, 340B and 342B, and 340C and 342C may have different values (not shown in FIG. 14). For example, the height of the permanent magnets 340A and 342A may be different than the height (not shown) of the permanent magnets 340B and 342B and from the height of the permanent magnets 340C and 342C (not shown in FIG. 14). In other preferred embodiments of the present invention, some of the opposed permanent magnet pairs may have heights identical to the heights of some other opposed permanent magnet pairs and different from the height of other different opposed permanent magnet pairs.

It is noted that while in the embodiment illustrated in FIG. 14 the coaxial permanent magnets 340A, 340B, 340C are not necessarily offset from each other along the common axis of symmetry 356, they may be offset for shimming purposes or they may be pre-designed to be initially offset along the common axis of symmetry 356.

Each of the coaxial permanent magnets 340A, 340B, 340C and 342A, 342B, 342C is movably attached to the ferromagnetic yoke 346 via a plurality of radially spaced apart set screws 362, for achieving shimming of the permanent magnet assemblies 340 and 342. The screws 362 are screwed into suitable threaded holes (the holes are not labeled for the sake of clarity of illustration) passing within the yoke 346. The screws 362 may be used for offsetting one or more of the coaxial permanent magnets 342A, 342B, 342C, 340A, 340B, 340C along the common axis 256 or for tilting one or more of the coaxial permanent magnets 342A, 342B, 342C, 340A, 340B, 340C at an angle with respect to the parallel surfaces 346A and 346B of the yoke 346, so as to achieve shimming and improve the homogeneity of the magnetic field in the volume 327 as disclosed in detail hereinabove. The screws 362 may or may not be attached to the permanent magnets 342A, 342B, 342C, 340A, 340B, 340C.

The direction of magnetization (not shown) of both of the annular permanent magnets within a single opposing pair of annular permanent magnets (i.e. the pairs 340A and 342A, 340B and 342B, and 340C and 342C) is identical. However, the direction of magnetization of different opposing pairs of annular permanent magnets may or may not be identical depending, inter alia, on the particular design and dimensions of the permanent magnet assemblies and on required degree of homogeneity of the magnetic field in the volume 327.

The individual annular permanent magnets may be constructed as a single piece of permanently magnetized material. However, preferably, the annular permanent magnets are constructed from segments which are glued or attached together by a non-electrically conducting glue or material for reducing the development of eddy currents in the annular permanent magnets induced by the currents developed by the gradient coils (not shown) or RF coils (not shown) and/or active shimming coils (not shown).

The advantage of the MRI magnet disclosed in FIG. 13 is that it provides within the volume 327 a magnetic field that is stronger than the magnetic field provided by a magnet having identical magnet assemblies but lacking a ferromagnetic yoke. This increase in the magnetic field strength is due to the path for closing of the magnetic flux lines (not shown) of the permanent magnet assemblies 340 and 342 provided by the ferromagnetic yoke 346. Such an increase in the magnetic field strength improves the resolution of the MRI images obtained using the magnet of FIG. 13 and reduces the time required for image acquisition which is particularly desirable during the performance of interventional MRI.

It is noted that, while the yoke surfaces 346A and 346B of FIG. 14 are designed as two parallel planar surfaces which are perpendicular to the common axis of symmetry 356, other embodiments of the present invention may be constructed in which the yoke surfaces facing the volume of homogenous magnetic field are differently shaped. For example, any of the yoke structures and surfaces illustrated in FIGS. 7–12 of co-pending U.S. patent application Ser. No. 09/295,814, filed Feb. 9, 1999, titled "A METHOD FOR DESIGNING OPEN MAGNETS AND OPEN MAGNETIC APPARATUS FOR USE IN MRI/MRT PROBES", may also be used in the magnets of the present invention.

It is further noted that, while the ferromagnetic yokes 246 and 346 of the magnets illustrated in FIGS. 13 and 14, respectively, are made from a single solid piece of ferromagnetic material, other preferred embodiments of the magnets are possible in which the yokes 246 and 346 are constructed from a plurality of ferromagnetic members which are attached to each other by glue, by screws and bolts or in any other suitable way. Additionally, the yokes 246 and 346 may have passages or holes therein. For example, the yoke 346 may have a pair of opposing cylindrical holes (not shown) therewithin. The holes are equidistant from the center (not shown) of the volume 327 and are radially symmetric with respect o the axis 356. Such holes may be used for inserting a surgical instrument, a medical instrument, a guidance device or a calibration device into the region 354 between the magnet assemblies 340 and 342.

It is still further noted that, while for the sake of clarity of illustration, only the yoke and permanent magnets included in the magnets of FIGS. 13–14 are shown in detail, the magnets illustrated in FIGS. 13 and 14 may also include a temperature stabilization system (not shown in FIGS. 13–14) for stabilizing the temperature of the coaxial permanent magnets within the permanent magnet assemblies 240, 242, 340 and 342. The details of structure and operations of the temperature stabilization systems for MRI magnets are well known in the art are not shown hereinabove.

It is yet further noted that, similar to the magnet assemblies 240 and 242 and 340 and 342 structure disclosed in FIGS. 13–14, respectively, one or more of the complementary opposing pairs of coaxial annular permanent magnets 240A and 242A, 240B and 242B, and 240C and 242C, of FIG. 13 and one or more of the complementary opposing pairs of coaxial permanent magnets 340A and 342A, 340B and 342B, and 340C and 342C, of FIG. 14 may have stepped surfaces. In such preferred embodiments, the stepped surface of the first permanent magnet within such a complementary magnet pair is shaped as a mirror image of the stepped surface of the second permanent magnet within the same permanent magnet pair.

Finally, It is noted that, the shapes and the details of construction of the coaxial annular permanent magnets 240A, 240B, 240C and 242A, 242B, 242C of the permanent magnet assemblies 240 and 242, respectively, of FIG. 13 and of the coaxial permanent magnets 340A, 340B, 340C and 342A, 342B, 342C of the permanent magnet assemblies 340 and 342, respectively, may also be similar to the shapes and details of construction of the corresponding annular and non-annular permanent magnets disclosed in detail hereinabove or to the shapes and details of construction of annular and non-annular magnetic structures disclosed in detail in co-pending U.S. patent application to Panfil and Katznelson, Ser. No. 09/295,814, filed Feb. 9, 1999, titled "A METHOD FOR DESIGNING OPEN MAGNETS AND OPEN MAGNETIC APPARATUS FOR USE IN MRI/MRT PROBES" and illustrated in FIGS. 20A–20F, 21, 22 and 23 thereof.

It will be appreciated by the person skilled in the art that, due to the fact that the magnets of the present invention do not include magnetic field collimators overlying the permanent magnets such as the collimators disclosed by Panfil and Katznelson in the above referenced application, the concentric coaxial permanent magnets of the yoked magnets of FIGS. 13 and 14 of the present application cannot be constructed from a plurality of magnetic blocks having substantial voids therebetween (such as the magnetic block arrangement, disclosed in FIG. 5 of the above referenced Panfil and Kaznelson application), since the resulting non compensated non-uniformity of the generated magnetic field will result in an unacceptable inhomogeneity of the magnetic field in the volume 227 or 327. However, the concentric coaxial permanent magnets of the yoked magnets of FIGS. 13 and 14 of the present application may be constructed of a single monolithic piece of permanently magnetized material as disclosed and illustrated hereinabove and as illustrated in FIGS. 20A–20D and 21–23 of the above referenced Application to Panfil and Katznelson or may be constructed of a plurality of segments as shown in FIGS. 1, 4 and 11 of the present application and in FIGS. 20E and 20F of the above referenced Application to Panfil and Katznelson.

It is noted that, the ferromagnetic yoke of the yoked magnets of the present invention may be made of a single ferromagnetic material such as, but not limited to the ferromagnetic materials disclosed hereinabove. Alternatively, the ferromagnetic yoke of the yoked magnets of the present invention may be made using more than one ferromagnetic material, such as a combination of two or more ferromagnetic materials disclosed hereinabove. Preferably, when the yoke is made from yoke parts (not shown), a symmetrical arrangement of the yoke parts made from the same ferromagnetic material with respect to the center of the imaging volume axis of symmetry (the common axis of the opposing magnetic assemblies) is desirable for practical considerations. However, such symmetry is not an absolute requirement and asymmetric designs (with respect to the material from which opposing yoke parts are made) may also be used, provided that proper compensation methods are used to achieve magnetic field homogeneity suitable for performing magnetic resonance imaging, as is known in the art.

It will be appreciated that various modifications to the above-described embodiment will be apparent to those of ordinary skill in the art in light thereof. The above embodiments are provided by way of illustration and not by way of limitation.

What is claimed is:

1. A yoked magnetic structure for use in an MRI device to produce a predetermined volume of substantially uniform magnetic field in a region, said volume having an axis of symmetry parallel to the direction of said magnetic field, said magnetic structure comprising:

a first permanent magnet assembly having a first and a second surface thereof;

a second permanent magnet assembly having a first and a second surface thereof; and an open ferromagnetic yoke having a first yoke surface and a second yoke surface, said second yoke surface is shaped as a mirror image of said first yoke surface and is spaced apart from said first yoke surface along said axis of symmetry, said first permanent magnet assembly is attached to said ferromagnetic yoke at a first location with said first surface of said first permanent magnet assembly facing one side of said region and said second surface thereof facing said first yoke surface, said second permanent magnet assembly is attached to said ferromagnetic yoke at a second location with said first surface of said second permanent magnet assembly facing said first surface of said first permanent magnet assembly on an opposite side of said region, and said second surface of said second permanent magnet assembly facing said second yoke surface such that said region is between said first surface of said first permanent magnet assembly and said first surface of said second permanent magnet assembly, said first permanent magnet assembly having a first annular permanent magnet with a first and a second surface thereof, said first surface of said first annular permanent magnet being of a first magnetic polarity and said second surface of said first annular permanent magnet being of a second magnetic polarity, said first annular permanent magnet having an inside diameter, said first annular permanent magnet having at least a portion of said first surface of said first annular magnet lying in a first plane to provide a first magnetic field in said region, said first magnetic field having a zero rate of change in a first direction at a first point in said region, said first permanent magnet assembly also having at least a second annular or disc like magnet with a first and a second surface thereof, said first surface of said second annular magnet being of said first magnetic polarity and said second surface of said second annular permanent magnet being of said second magnetic polarity, said second annular permanent magnet having an outside diameter which is smaller than said inside diameter of said first annular permanent magnet, with at least a portion of said first surface of said second annular magnet lying in a second plane spaced from said first plane to provide a second magnetic field whereby said second magnetic field is superimposed upon said first magnetic field in said region, having a zero rate of change in said first direction at a second point different from said first point, said second permanent magnet assembly having a third annular permanent magnet with a first and a second surface thereof, said first surface of said third annular permanent magnet being of said second magnetic polarity and said second surface of said third annular permanent magnet being of said first magnetic polarity, said third annular permanent magnet having an inside diameter, said third annular permanent magnet having at least a portion of said first surface of said third annular magnet lying in a third plane to provide a third magnetic field, such that said third magnetic field is superimposed on said first and second magnetic fields in said region, having a zero rate of change in said first direction at a third point different from said first and second points, said second permanent magnet assembly also having at least a fourth annular permanent magnet having a first and a second surface thereof, said first surface of said fourth annular magnet being of said second magnetic polarity and said second surface of said fourth annular permanent magnet being of said first magnetic polarity, said fourth annular permanent magnet having an outside diameter which is smaller than said inside diameter of said third annular permanent magnet, with at least a portion of said first surface of said fourth annular permanent magnet lying in a fourth plane spaced from said third plane to provide a fourth magnetic field, whereby said fourth magnetic field is superimposed upon said first, second and third magnetic fields, in said region, having a zero rate of change in said first direction at a fourth point different from said first, second and third points.

2. The magnetic structure according to claim 1, wherein said first and second permanent magnet assemblies further comprise an outer casing, capable of attachment to said ferromagnetic yoke, for mounting said first permanent magnet assembly and said second permanent magnet assembly in opposing relationships by a plurality of movable screws.

3. The magnetic structure according to claim 1, wherein said magnetic structure allows lateral access around a patient's body part located between said first permanent magnet assembly and said second permanent magnet assembly.

4. The magnetic structure according to claim 3 wherein said yoke has two hollow passages passing therethrough to provide additional access paths to said patient's body part by allowing tools to be inserted through said hollow passages to reach said patient's body part.

5. The magnetic structure according to claim 1, wherein said magnetic structure further comprises an outer casing capable of attachment to said ferromagnetic yoke for mounting said first and second permanent magnet assemblies in opposing relationships by a plurality of adjustment screws, said screws are attached to and adapted to move at least one of said first annular permanent magnet, said at least second annular permanent magnet, said third annular permanent magnet and said at least fourth annular permanent magnet to improve the uniformity of said magnetic field.

6. The magnetic structure according to claim 1, wherein said magnetic structure further comprises shaped mumetal shims, fragments of soft iron and fragments of magnetic material of various polarities, disposed on said first or second surface of one or more of said annular permanent magnets, to improve the uniformity of said magnetic field.

7. The magnetic structure according to claim 1, wherein said magnetic structure further comprises an individual temperature control for each of said annular permanent magnets, thereby improving the uniformity of said magnetic field.

8. The magnetic structure according to claim 1 wherein said magnetic structure is movable by a MRI compatible motor control in a vertical and a series of horizontal directions, so that a composite image may be formed.

9. The magnetic structure according to claim 1, wherein at least one of said first annular permanent magnet, said at least second annular permanent magnet, said third annular permanent magnet and said at least fourth annular permanent magnet comprises a plurality of permanently magnetized segments, each attached to its respective neighboring segments by means of a non-conductive adhesive to reduce eddy currents.

10. The magnetic structure according to claim 1, wherein said first permanent magnet assembly and said second permanent magnet assembly have an equal number of annular permanent magnets.

11. The magnetic structure according to claim 1, wherein said ferromagnetic yoke is made of a ferromagnetic material selected from soft iron, a iron-silicon alloy, a nickel-iron alloy, an iron-cobalt-vanadium alloy, soft ferrite, and any combination thereof.

12. The magnetic structure according to claim 1, wherein said first yoke surface and said second yoke surface are flat surfaces parallel to each other and perpendicular to said axis of symmetry.

13. The magnetic structure according to claim 1, wherein said first yoke surface and said second yoke surface are stepped surfaces.

14. The magnetic structure according to claim 1, wherein each of said first yoke surface and said second yoke surface have at least one portion thereof perpendicular to said axis of symmetry.

15. The magnetic structure according to claim 1, wherein said ferromagnetic yoke is a monolithic yoke comprising a single piece of ferromagnetic material.

16. The magnetic structure according to claim 1, wherein said ferromagnetic yoke comprises a plurality of parts of ferromagnetic material.

17. The magnetic structure according to claim 1, wherein said ferromagnetic yoke is selected from a U-shaped yoke and a C-shaped yoke.

18. A yoked magnetic structure for use in an MRI device to produce a predetermined volume of substantially uniform magnetic field in a region, said volume having an axis of symmetry parallel to the direction of said magnetic field, said magnetic structure comprising:

a first permanent magnet assembly having a first and a second surface thereof;

a second permanent magnet assembly having a first and a second surface thereof; and an open ferromagnetic yoke having a first yoke surface and a second yoke surface, said second yoke surface is shaped as a mirror image of said first yoke surface and is spaced apart from said first yoke surface along said axis of symmetry, said first permanent magnet assembly is attached to said ferromagnetic yoke at a first location with said first surface of said first magnetic assembly facing one side of said region and said second surface thereof facing said first yoke surface, said second permanent magnet assembly is attached to said ferromagnetic yoke at a second location with said first surface of said second permanent magnet assembly facing said first surface of said first permanent magnet assembly on an opposite side of said region, and said second surface of said second permanent magnet assembly facing said second yoke surface such that said region is between said first surface of said first permanent magnet assembly and said first surface of said second permanent magnet assembly, said first permanent magnet assembly having a first annular permanent magnet with a first and a second surface thereof, said first annular permanent magnet is radially symmetric with respect to said axis of symmetry, said first surface of said first annular permanent magnet being of a first magnetic polarity and said second surface of said first annular permanent magnet being of a second magnetic polarity, said first annular permanent magnet having an inside diameter, said first annular permanent magnet having at least a portion of said first surface of said first annular magnet lying in a first plane to provide a first magnetic field in said region, said first magnetic field having a zero rate of change in a first direction at a first point in said region, said first permanent magnet assembly also having at least a second permanent magnet with a first and a second surface thereof, said second permanent magnet is radially symmetric with respect to said axis of symmetry, said first surface of said second permanent magnet being of said first magnetic polarity and said second surface of said second permanent magnet being of said second magnetic polarity, said second permanent magnet having an outside diameter which is smaller than said inside diameter of said first annular permanent magnet, with at least a portion of said first surface of said second magnet lying in a second plane spaced from said first plane to provide a second magnetic field whereby said second magnetic field is superimposed upon said first magnetic field in said region, having a zero rate of change in said first direction at a second point different from said first point, said second permanent magnet assembly having a third annular permanent magnet with a first and a second surface thereof, said third annular permanent magnet is radially symmetric with respect to said axis of symmetry, said first surface of said third annular permanent magnet being of said second magnetic polarity and said second surface of said third annular permanent magnet being of said first magnetic polarity, said third annular permanent magnet having an inside diameter, said third annular permanent magnet having at least a portion of said first surface of said third annular magnet lying in a third plane to provide a third magnetic field, such that said third magnetic field is superimposed on said first and second magnetic fields in said region, having a zero rate of change in said first direction at a third point different from said first and second points, said second permanent magnet assembly also having at least a fourth permanent magnet having a first and a second surface thereof, said fourth permanent magnet is radially symmetric with respect to said axis of symmetry, said first surface of said fourth permanent magnet being of said second magnetic polarity and said second surface of said fourth permanent magnet being of said first magnetic polarity, said fourth permanent magnet having an outside diameter which is smaller than said inside diameter of said third annular permanent magnet, with at least a portion of said first surface of said fourth permanent magnet lying in a fourth plane spaced from said third plane to provide a fourth magnetic field, whereby said fourth magnetic field is superimposed upon said first, second and third magnetic fields, in said region, having a zero rate of change in said first direction at a fourth point different from said first, second and third points.

19. The yoked magnetic structure according to claim 18, wherein said second and said fourth permanent magnets are selected from annular permanent magnets, cylindrical permanent magnets, right regular polygonal prism shaped permanent magnets and right regular polygonal annular permanent magnets.

20. The yoked magnetic structure according to claim 18, wherein said first and said third annular permanent magnets are selected from annular permanent magnets, and right regular polygonal annular permanent magnets.

21. The magnetic structure according to claim 18, wherein said first and second permanent magnet assemblies further comprise an outer casing, capable of attachment to said ferromagnetic yoke, for mounting said first permanent magnet assembly and said second permanent magnet assembly in opposing relationships by a plurality of movable screws.

22. The magnetic structure according to claim 18, wherein said magnetic structure allows lateral access around a patient's body part located between said first permanent magnet assembly and said second permanent magnet assembly.

23. The magnetic structure according to claim 22 wherein said ferromagnetic yoke has two hollow passages passing therethrough to provide additional access paths to said patient's body part by allowing tools to be inserted through said hollow passages to reach said patient's body part.

24. The magnetic structure according to claim 18, wherein said magnetic structure further comprises an outer casing capable of attachment to said ferromagnetic yoke for mounting said first and second permanent magnet assemblies in opposing relationships by a plurality of adjustment screws, wherein said screws are attached to and adapted to move at least one of said first annular permanent magnet, said at least second permanent magnet, said third annular permanent magnet and said at least fourth permanent magnet to improve the uniformity of said magnetic field.

25. The magnetic structure according to claim 18, wherein said magnetic structure further comprises shaped mumetal shims, fragments of soft iron and fragments of magnetic material of various polarities, disposed on said first or said second surface of one or more of said annular permanent magnets, to improve the uniformity of said magnetic field.

26. The magnetic structure according to claim 18, wherein said magnetic structure further comprises a temperature control for at least one of said permanent magnets, to improve the uniformity of said magnetic field.

27. The magnetic structure according to claim 18, wherein said magnetic structure is movable by a MRI compatible motor control in a vertical and a series of horizontal directions, so that a composite image may be formed.

28. The magnetic structure according to claim 18, wherein at least one of said first annular permanent magnet, said at least second permanent magnet, said third annular permanent magnet and said at least fourth permanent magnet comprises a plurality of permanently magnetized segments, each attached to its respective neighboring segments by means of a non-conductive adhesive to reduce eddy currents.

29. The magnetic structure according to claim 18, wherein said first permanent magnet assembly and said second permanent magnet assembly have an equal number of permanent magnets.

30. The magnetic structure according to claim 18, wherein said ferromagnetic yoke is made of a ferromagnetic material selected from soft iron, a iron-silicon alloy, a nickel-iron alloy, an iron-cobalt-vanadium alloy, soft ferrite, and any combination thereof.

31. The magnetic structure according to claim 18, wherein said first yoke surface and said second yoke surface are flat surfaces parallel to each other and perpendicular to said axis of symmetry.

32. The magnetic structure according to claim 18, wherein said first yoke surface and said second yoke surface are stepped surfaces.

33. The magnetic structure according to claim 18, wherein each of said first yoke surface and said second yoke surface have at least one portion thereof perpendicular to said axis of symmetry.

34. The magnetic structure according to claim 18, wherein said ferromagnetic yoke is a monolithic yoke comprising a single piece of ferromagnetic material.

35. The magnetic structure according to claim 18, wherein said ferromagnetic yoke comprises a plurality of parts of ferromagnetic material.

36. The magnetic structure according to claim 18, wherein said ferromagnetic yoke is selected from a U-shaped yoke and a C-shaped yoke.

\* \* \* \* \*